US012224857B2

(12) United States Patent
Berger et al.

(10) Patent No.: US 12,224,857 B2
(45) Date of Patent: Feb. 11, 2025

(54) TECHNIQUES FOR IMPLEMENTING REED-SOLOMON CODING

(71) Applicant: QUALCOMM Incorporated, San Diego, CA (US)

(72) Inventors: Peer Berger, Hod Hasharon (IL); Shay Landis, Hod Hasharon (IL); Assaf Touboul, Netanya (IL)

(73) Assignee: QUALCOMM Incorporated, San Diego, CA (US)

( * ) Notice: Subject to any disclaimer, the term of this patent is extended or adjusted under 35 U.S.C. 154(b) by 349 days.

(21) Appl. No.: 17/748,579

(22) Filed: May 19, 2022

(65) Prior Publication Data

US 2023/0379080 A1 Nov. 23, 2023

(51) Int. Cl.
*H04L 1/00* (2006.01)
*H03M 13/15* (2006.01)
*H03M 13/25* (2006.01)

(52) U.S. Cl.
CPC ...... *H04L 1/0063* (2013.01); *H03M 13/1515* (2013.01); *H03M 13/255* (2013.01); *H04L 1/0027* (2013.01)

(58) Field of Classification Search
CPC ... H04L 1/0063; H04L 1/0027; H04L 1/0047; H04L 1/0075; H04L 1/0057; H03M 13/1515; H03M 13/255; H03M 13/09; H03M 13/353; H03M 13/356; H03M 13/6306; H03M 13/6511; H03M 13/6513; H03M 13/35; H03M 13/1102
See application file for complete search history.

(56) References Cited

U.S. PATENT DOCUMENTS

2019/0363843 A1* 11/2019 Gordaychik .............. H04L 1/08
2021/0306005 A1* 9/2021 Sheiman ............... H03M 13/13
2022/0329359 A1* 10/2022 Korpi .................... H04L 1/1812

* cited by examiner

*Primary Examiner* — Sudesh M Patidar
(74) *Attorney, Agent, or Firm* — Holland & Hart LLP

(57) ABSTRACT

Methods, systems, and devices for wireless communications are described. A user equipment (UE) may transmit an indication to a network entity that the UE is capable of decoding Reed-Solomon codes and that the UE is capable of performing near maximal likelihood demodulation. The network entity may transmit a message indicating that a Reed-Solomon code is applied to one or more scheduled signals based at least in part on the indication. The network entity may apply Reed-Solomon coding to a signal of the one or more scheduled signals based at least in part on the message. The UE may apply near maximal likelihood demodulation and Reed-Solomon decoding to a received signal of the one or more scheduled signals based at least in part on the message.

30 Claims, 15 Drawing Sheets

TECHNIQUES FOR IMPLEMENTING REED-SOLOMON CODING

FIELD OF TECHNOLOGY

The following relates to wireless communications, including techniques for implementing Reed-Solomon (RS) coding.

BACKGROUND

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (FDMA), orthogonal FDMA (OFDMA), or discrete Fourier transform spread orthogonal frequency division multiplexing (DFT-S-OFDM). A wireless multiple-access communications system may include one or more base stations, each supporting wireless communication for communication devices, which may be known as user equipment (UE).

In some wireless communication networks, a transmitting device may encode a signal in accordance with a coding scheme and may transmit the encoded signal to a receiving device. Upon receiving the encoded signal, the receiving device, such as a UE, may apply demodulation schemes and decoding schemes to identify the original signal. Techniques associated with performing such coding and modulation schemes may be improved.

SUMMARY

The described techniques relate to improved methods, systems, devices, and apparatuses that support techniques for implementing Reed-Solomon (RS) coding. Generally, a user equipment (UE) may apply demodulation schemes (e.g., a maximum likelihood (ML) demodulation, a near ML demodulation, or a minimum mean square error (MMSE) demodulation, etc.) and decoding schemes (e.g., low-density parity-check (LDPC) coding, RS coding, etc.) to a received message to identify the information included in the message. In some cases, devices may be configured to implement RS coding schemes to improve throughput and power consumption such as in high throughput scenarios. Implementing the RS coding schemes may be based on the UE using near ML demodulation to demodulate a received message. In high throughput scenarios, the RS decoding may result in relatively lower complexity and a reduced power consumption in comparison with LDPC decoding, and while LDPC decoding is typically more robust than RS decoding, in some cases, the RS decoding may result in improved performance such as during high throughput scenarios.

In some cases, the UE may report to a network entity whether the UE has RS decoding capability, near ML demodulation capability, or both, as part of a capability report, for example. In some examples, the UE may request for the network entity to apply RS coding to one or more scheduled signals. In some examples, the network entity may transmit an indication to the UE indicating whether to implement RS decoding, LDPC decoding, etc. for one or more signals received by the UE by transmitting downlink control information (DCI), a radio resource control (RRC) configuration, a medium access control element (MAC-CE), or a combination thereof that includes the indication.

Accordingly, a network entity may indicate a coding scheme (e.g., RS decoding or LDPC decoding) to a UE, the network entity may apply the indicated coding scheme to one or more signals, and the network entity may transmit the coded signals to the UE. Upon receiving the coded signals, the UE may apply near ML demodulation and the indicated decoding scheme to the received signals. For example, a UE may transmit an indication that the UE is capable of decoding RS codes and that the UE is capable of performing near maximal likelihood demodulation. The UE may receive a message indicating that an RS code is applied to one or more scheduled signals based at least in part on the indication, and the UE may apply near maximal likelihood demodulation and RS decoding to a received signal of the one or more scheduled signals based at least in part on the message.

A method for wireless communications at a UE is described. The method may include transmitting an indication that the UE is capable of decoding RS codes and that the UE is capable of performing near maximal likelihood demodulation, receiving a message indicating that a RS code is applied to one or more scheduled signals based on the indication, and applying near maximal likelihood demodulation and RS decoding to a received signal of the one or more scheduled signals based on the message.

An apparatus for wireless communications at a UE is described. The apparatus may include a processor, memory coupled with the processor, and instructions stored in the memory. The instructions may be executable by the processor to cause the apparatus to transmit an indication that the UE is capable of decoding RS codes and that the UE is capable of performing near maximal likelihood demodulation, receive a message indicating that a RS code is applied to one or more scheduled signals based on the indication, and apply near maximal likelihood demodulation and RS decoding to a received signal of the one or more scheduled signals based on the message.

Another apparatus for wireless communications at a UE is described. The apparatus may include means for transmitting an indication that the UE is capable of decoding RS codes and that the UE is capable of performing near maximal likelihood demodulation, means for receiving a message indicating that a RS code is applied to one or more scheduled signals based on the indication, and means for applying near maximal likelihood demodulation and RS decoding to a received signal of the one or more scheduled signals based on the message.

A non-transitory computer-readable medium storing code for wireless communications at a UE is described. The code may include instructions executable by a processor to transmit an indication that the UE is capable of decoding RS codes and that the UE is capable of performing near maximal likelihood demodulation, receive a message indicating that a RS code is applied to one or more scheduled signals based on the indication, and apply near maximal likelihood demodulation and RS decoding to a received signal of the one or more scheduled signals based on the message.

Some examples of the method, apparatuses, and non-transitory computer-readable medium described herein may further include operations, features, means, or instructions for transmitting a request for the RS code to be applied to the one or more scheduled signals, where receiving the message may be based on the request.

In some examples of the method, apparatuses, and non-transitory computer-readable medium described herein, the UE transmits the request with the indication that the UE may be capable of decoding RS codes and that the UE may be capable of performing near maximal likelihood demodulation.

Some examples of the method, apparatuses, and non-transitory computer-readable medium described herein may further include operations, features, means, or instructions for transmitting a channel state information report including uplink control information, where the UE includes the request with the uplink control information.

Some examples of the method, apparatuses, and non-transitory computer-readable medium described herein may further include operations, features, means, or instructions for determining that the UE may be operating at high throughput, with high power consumption, or both, where transmitting the request may be based on the determination.

In some examples of the method, apparatuses, and non-transitory computer-readable medium described herein, the high throughput may be associated with a high signal-to-noise ratio (SNR), a large constellation, a high code rate, a large number of layers, a rank, or a combination thereof.

In some examples of the method, apparatuses, and non-transitory computer-readable medium described herein, receiving the message may include operations, features, means, or instructions for receiving DCI indicating that the RS code may be applied to the one or more scheduled signals.

In some examples of the method, apparatuses, and non-transitory computer-readable medium described herein, receiving the message may include operations, features, means, or instructions for receiving an RRC message indicating that the RS code may be applied to the one or more scheduled signals.

In some examples of the method, apparatuses, and non-transitory computer-readable medium described herein, receiving the message may include operations, features, means, or instructions for receiving a MAC-CE message indicating that the RS code may be applied to the one or more scheduled signals.

In some examples of the method, apparatuses, and non-transitory computer-readable medium described herein, transmitting the indication may include operations, features, means, or instructions for transmitting an RRC message, a MAC-CE message, or an uplink control information message including the indication that the UE may be capable of decoding RS codes and that the UE may be capable of performing near maximal likelihood demodulation.

Some examples of the method, apparatuses, and non-transitory computer-readable medium described herein may further include operations, features, means, or instructions for receiving a second message indicating that a Low-Density-Parity Check (LDPC) code may be applied to one or more other scheduled signals and applying near the maximal likelihood demodulation and LDPC decoding to the one or more other scheduled signals based on the second message.

Some examples of the method, apparatuses, and non-transitory computer-readable medium described herein may further include operations, features, means, or instructions for transmitting a request for the RS code to be applied to the one or more other scheduled signals, where the UE receives the second message irrespective of the request.

Some examples of the method, apparatuses, and non-transitory computer-readable medium described herein may further include operations, features, means, or instructions for receiving a downlink shared channel, the downlink shared channel including the received signal.

A method for wireless communications at a network entity is described. The method may include receiving an indication that a UE is capable of decoding RS codes and that the UE is capable of performing near maximal likelihood demodulation, transmitting a message indicating that a RS code is applied to one or more scheduled signals based on the indication, and applying RS coding to a signal of the one or more scheduled signals based on the message.

An apparatus for wireless communications at a network entity is described. The apparatus may include a processor, memory coupled with the processor, and instructions stored in the memory. The instructions may be executable by the processor to cause the apparatus to receive an indication that a UE is capable of decoding RS codes and that the UE is capable of performing near maximal likelihood demodulation, transmit a message indicating that a RS code is applied to one or more scheduled signals based on the indication, and apply RS coding to a signal of the one or more scheduled signals based on the message.

Another apparatus for wireless communications at a network entity is described. The apparatus may include means for receiving an indication that a UE is capable of decoding RS codes and that the UE is capable of performing near maximal likelihood demodulation, means for transmitting a message indicating that a RS code is applied to one or more scheduled signals based on the indication, and means for applying RS coding to a signal of the one or more scheduled signals based on the message.

A non-transitory computer-readable medium storing code for wireless communications at a network entity is described. The code may include instructions executable by a processor to receive an indication that a UE is capable of decoding RS codes and that the UE is capable of performing near maximal likelihood demodulation, transmit a message indicating that a RS code is applied to one or more scheduled signals based on the indication, and apply RS coding to a signal of the one or more scheduled signals based on the message.

Some examples of the method, apparatuses, and non-transitory computer-readable medium described herein may further include operations, features, means, or instructions for receiving a request for the network entity to apply the RS code to the one or more scheduled signals, where transmitting the message and applying the RS coding to the signal may be based on the request.

In some examples of the method, apparatuses, and non-transitory computer-readable medium described herein, the request may be included with the indication that the UE may be capable of decoding RS codes and that the UE may be capable of performing near the maximal likelihood demodulation.

Some examples of the method, apparatuses, and non-transitory computer-readable medium described herein may further include operations, features, means, or instructions for receiving a channel state information report including uplink control information, where the request may be included with the uplink control information.

Some examples of the method, apparatuses, and non-transitory computer-readable medium described herein may further include operations, features, means, or instructions for determining that the UE may be operating at high throughput, with high power consumption, or both, where transmitting the message and applying the RS coding to the signal may be based on the determination.

In some examples of the method, apparatuses, and non-transitory computer-readable medium described herein, the high throughput may be associated with a high SNR, a large constellation, a high code rate, a large number of layers, a rank, or a combination thereof.

In some examples of the method, apparatuses, and non-transitory computer-readable medium described herein, transmitting the message may include operations, features, means, or instructions for transmitting DCI indicating that the RS code may be applied to the one or more scheduled signals.

In some examples of the method, apparatuses, and non-transitory computer-readable medium described herein, transmitting the message may include operations, features, means, or instructions for transmitting an RRC message indicating that the RS code may be applied to the one or more scheduled signals.

In some examples of the method, apparatuses, and non-transitory computer-readable medium described herein, transmitting the message may include operations, features, means, or instructions for transmitting a MAC-CE message indicating that the RS code may be applied to the one or more scheduled signals.

In some examples of the method, apparatuses, and non-transitory computer-readable medium described herein, receiving the indication may include operations, features, means, or instructions for receiving an RRC message, a MAC-CE message, or an uplink control information message including the indication that the UE may be capable of decoding RS codes and that the UE may be capable of performing near maximal likelihood demodulation.

Some examples of the method, apparatuses, and non-transitory computer-readable medium described herein may further include operations, features, means, or instructions for transmitting a second message indicating that a Low-Density-Parity Check (LDPC) code may be applied to one or more other scheduled signals and applying LDPC coding to the one or more other scheduled signals in accordance with the second message.

Some examples of the method, apparatuses, and non-transitory computer-readable medium described herein may further include operations, features, means, or instructions for receiving a request for the network entity to apply the RS code to the one or more other scheduled signals and determining to apply LDPC coding to the one or more other scheduled signals irrespective of the request, where transmitting the second message and applying LDPC coding may be based on the determination.

Some examples of the method, apparatuses, and non-transitory computer-readable medium described herein may further include operations, features, means, or instructions for transmitting a downlink shared channel, the downlink shared channel including the signal.

DETAILED DESCRIPTION

Figure 1:
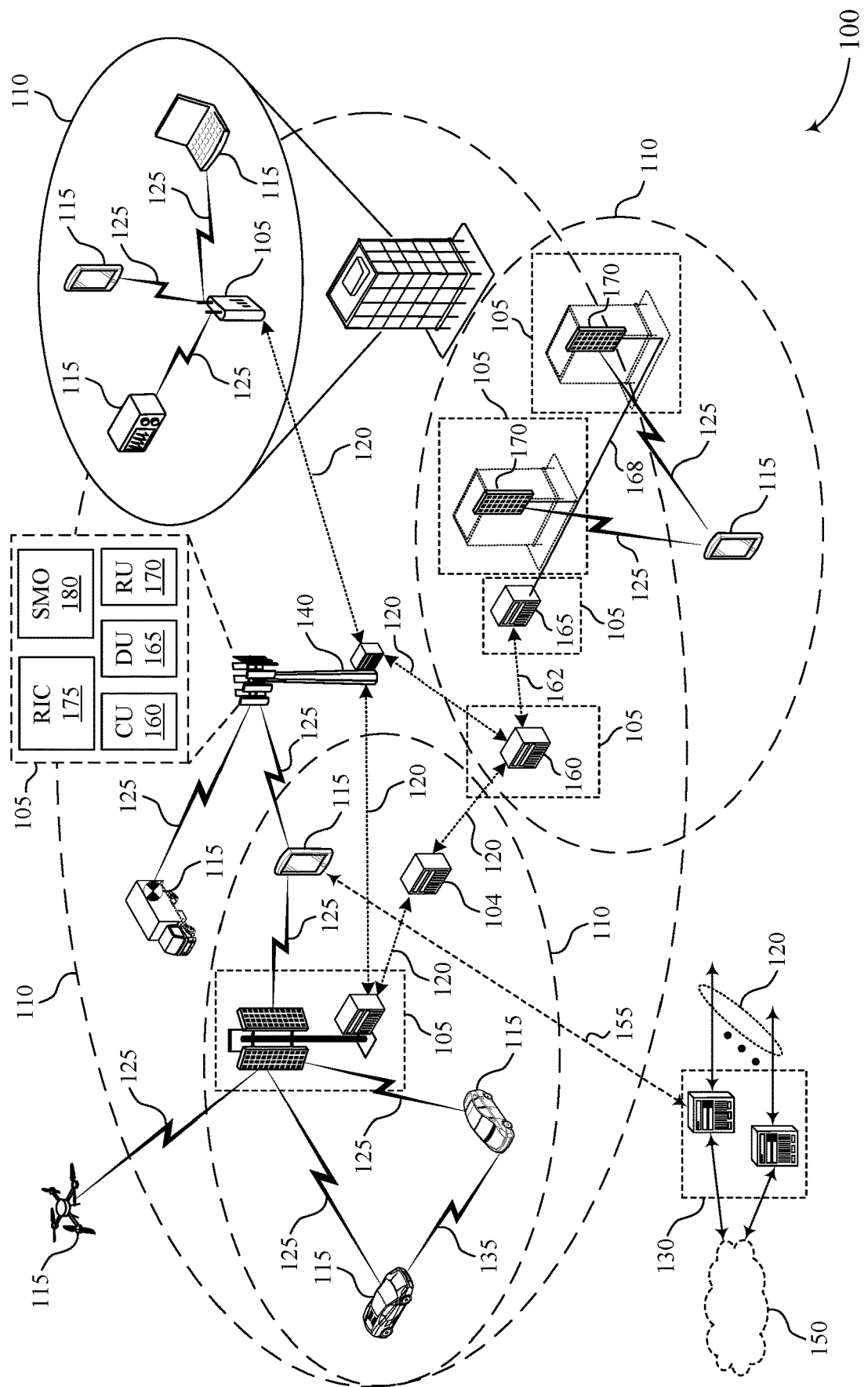
FIG. 1 illustrates an example of a wireless communications system that supports techniques for implementing Reed-Solomon (RS) coding in accordance with one or more aspects of the present disclosure.

In some wireless communications systems, a user equipment (UE) and a network entity may communicate with one another, such as by exchanging control signals, data signals, etc. The network entity may encode and modulate information in a message, and the network entity may transmit the message to the UE. The UE may receive the message via a communications link (e.g., a wireless communications link), and the UE may apply demodulation schemes and decoding schemes to the message to identify the information included in the message. The demodulation schemes may include a maximum likelihood (ML) demodulation, a near ML demodulation, a minimum mean square error (MMSE) demodulation, etc. For example, a UE may use a near ML demodulator to demodulate a received message prior to decoding. The near ML demodulator may output a ratio (e.g., log-likelihood ratios (LLRs)) indicative of a demodulated bit value and a likelihood that the bit value is correct. In some examples, the near ML demodulator may output an incorrect demodulate bit value due to LLR bias. However, in some cases, such as high throughput scenarios (e.g., a large number of layers, a large constellation, a high code rate, a high signal-to-noise ratio (SNR), etc.), near ML demodulation may be more affected by LLR bias than MMSE demodulation or ML demodulation, and the near ML demodulator may output an incorrect bit value and assign a high confidence that the bit value is correct. For example, the more layers and the higher the constellation, the near ML solution may deviate more and more from an ML solution. Therefore, the near ML solution will result in more bursts due to the successive nature of the near ML demodulator, especially in high rates.

In some examples, decoding schemes may be associated with soft decoders (e.g., a low-density parity-check (LDPC) decoder), hard decoders (e.g., a Reed-Solomon (RS) decoder), or a combination thereof. In this example, soft decoders, such as an LDPC decoder, may propagate the errors associated with the high throughput scenario due to the LLR bias. Specifically, in a scenario with high SNR, a majority of the LLRs may not be decoded (e.g., the LLRs may be clipped), which may result in a loss of information bits (e.g., less soft information). Additionally, LDPC decoders may result in high power consumption and performance degradation at the UE due to high error propagation when applying near ML demodulation in high throughout scenarios. For example, the binary nature of the soft LDPC decoder may propagate near ML errors by decoding LLRs with an incorrect sign at a burst of up to m bits (e.g., m may be the number of bits in the channel constellation).

The features described herein generally relate to implementing RS coding techniques to increase throughput and reduce power consumption of a wireless communications system. For example, the UE may use an RS decoder to improve throughput and power consumption in high throughput scenarios based on the UE using near ML demodulation. Specifically, during high throughput scenarios, the RS decoder may decode the message with a relatively lower complexity and a reduced power consumption in comparison with the LDPC decoder, and while an LDPC decoder may typically be more robust than an RS decoder, the RS decoder may result in improved performance during high throughput compared to the LDPS decoder.

In some cases, the UE may report to a network entity, or some other communications device (e.g., another UE, a network node) whether the UE has RS decoding capability, near ML demodulation capability, or both, as part of a capability report, for example. In some examples, the UE may request the network entity to implement RS coding techniques for one or more scheduled signals, such as if the UE detects a high throughout scenario. In some examples, the network entity may transmit an indication to the UE indicating whether the UE is to use RS decoding, or some other decoding technique (e.g., LDPC decoding) by transmitting downlink control information (DCI), a radio resource control (RRC) message, a medium access control element (MAC-CE) message, or a combination thereof that includes the indication. Accordingly, a network entity may indicate, to a UE, a coding scheme (e.g., RS decoding, LDPC decoding) applied to one or more scheduled signals, the network entity may apply the indicated coding scheme to the one or more signals, and the network entity may transmit the coded signals to the UE. Upon receiving the coded signals, the UE may apply near ML demodulation and the indicated decoding scheme to the received signals to identify the information included in the signals.

Aspects of the disclosure are initially described in the context of wireless communications systems. Aspects of the disclosure are illustrated by and described with reference to a process flow. Aspects of the disclosure are further illustrated by and described with reference to apparatus diagrams, system diagrams, and flowcharts that relate to techniques for implementing RS coding.

FIG. 1 illustrates an example of a wireless communications system 100 that supports techniques for implementing RS coding in accordance with one or more aspects of the present disclosure. The wireless communications system 100 may include one or more network entities 105, one or more UEs 115, and a core network 130. In some examples, the wireless communications system 100 may be a Long Term Evolution (LTE) network, an LTE-Advanced (LTE-A) network, an LTE-A Pro network, a New Radio (NR) network, or a network operating in accordance with other systems and radio technologies, including future systems and radio technologies not explicitly mentioned herein.

The network entities 105 may be dispersed throughout a geographic area to form the wireless communications system 100 and may include devices in different forms or having different capabilities. In various examples, a network entity 105 may be referred to as a network element, a mobility element, a radio access network (RAN) node, or network equipment, among other nomenclature. In some examples, network entities 105 and UEs 115 may wirelessly communicate via one or more communication links 125 (e.g., a radio frequency (RF) access link). For example, a network entity 105 may support a coverage area 110 (e.g., a geographic coverage area) over which the UEs 115 and the network entity 105 may establish one or more communication links 125. The coverage area 110 may be an example of a geographic area over which a network entity 105 and a UE 115 may support the communication of signals according to one or more radio access technologies (RATs).

The UEs 115 may be dispersed throughout a coverage area 110 of the wireless communications system 100, and each UE 115 may be stationary, or mobile, or both at different times. The UEs 115 may be devices in different forms or having different capabilities. Some example UEs 115 are illustrated in FIG. 1. The UEs 115 described herein may be able to communicate with various types of devices, such as other UEs 115 or network entities 105, as shown in FIG. 1.

As described herein, a node of the wireless communications system 100, which may be referred to as a network node, or a wireless node, may be a network entity 105 (e.g., any network entity described herein), a UE 115 (e.g., any UE described herein), a network controller, an apparatus, a device, a computing system, one or more components, or another suitable processing entity configured to perform any of the techniques described herein. For example, a node may be a UE 115. As another example, a node may be a network entity 105. As another example, a first node may be configured to communicate with a second node or a third node. In one aspect of this example, the first node may be a UE 115, the second node may be a network entity 105, and the third node may be a UE 115. In another aspect of this example, the first node may be a UE 115, the second node may be a network entity 105, and the third node may be a network entity 105. In yet other aspects of this example, the first, second, and third nodes may be different relative to these examples. Similarly, reference to a UE 115, network entity 105, apparatus, device, computing system, or the like may include disclosure of the UE 115, network entity 105, apparatus, device, computing system, or the like being a node. For example, disclosure that a UE 115 is configured to receive information from a network entity 105 also discloses that a first node is configured to receive information from a second node.

In some examples, network entities 105 may communicate with the core network 130, or with one another, or both. For example, network entities 105 may communicate with the core network 130 via one or more backhaul communication links 120 (e.g., in accordance with an S1, N2, N3, or other interface protocol). In some examples, network entities 105 may communicate with one another over a backhaul communication link 120 (e.g., in accordance with an X2, Xn, or other interface protocol) either directly (e.g., directly between network entities 105) or indirectly (e.g., via a core network 130). In some examples, network entities 105 may communicate with one another via a midhaul communication link 162 (e.g., in accordance with a midhaul interface protocol) or a fronthaul communication link 168 (e.g., in accordance with a fronthaul interface protocol), or any combination thereof. The backhaul communication links 120, midhaul communication links 162, or fronthaul communication links 168 may be or include one or more wired links (e.g., an electrical link, an optical fiber link), one or more wireless links (e.g., a radio link, a wireless optical link), among other examples or various combinations thereof. A UE 115 may communicate with the core network 130 through a communication link 155.

One or more of the network entities 105 described herein may include or may be referred to as a base station 140 (e.g., a base transceiver station, a radio base station, an NR base station, an access point, a radio transceiver, a NodeB, an eNodeB (eNB), a next-generation NodeB or a giga-NodeB (either of which may be referred to as a gNB), a 5G NB, a next-generation eNB (ng-eNB), a Home NodeB, a Home eNodeB, or other suitable terminology). In some examples, a network entity 105 (e.g., a base station 140) may be implemented in an aggregated (e.g., monolithic, standalone) base station architecture, which may be configured to utilize a protocol stack that is physically or logically integrated within a single network entity 105 (e.g., a single RAN node, such as a base station 140).

In some examples, a network entity 105 may be implemented in a disaggregated architecture (e.g., a disaggregated base station architecture, a disaggregated RAN architecture), which may be configured to utilize a protocol stack that is physically or logically distributed among two or more network entities 105, such as an integrated access backhaul (IAB) network, an open RAN (O-RAN) (e.g., a network configuration sponsored by the O-RAN Alliance), or a virtualized RAN (vRAN) (e.g., a cloud RAN (C-RAN)). For example, a network entity 105 may include one or more of a central unit (CU) 160, a distributed unit (DU) 165, a radio unit (RU) 170, a RAN Intelligent Controller (RIC) 175 (e.g., a Near-Real Time RIC (Near-RT RIC), a Non-Real Time RIC (Non-RT RIC)), a Service Management and Orchestration (SMO) 180 system, or any combination thereof. An RU 170 may also be referred to as a radio head, a smart radio head, a remote radio head (RRH), a remote radio unit (RRU), or a transmission reception point (TRP). One or more components of the network entities 105 in a disaggregated RAN architecture may be co-located, or one or more components of the network entities 105 may be located in distributed locations (e.g., separate physical locations). In some examples, one or more network entities 105 of a disaggregated RAN architecture may be implemented as virtual units (e.g., a virtual CU (VCU), a virtual DU (VDU), a virtual RU (VRU)).

The split of functionality between a CU 160, a DU 165, and an RU 170 is flexible and may support different functionalities depending upon which functions (e.g., network layer functions, protocol layer functions, baseband functions, RF functions, and any combinations thereof) are performed at a CU 160, a DU 165, or an RU 170. For example, a functional split of a protocol stack may be employed between a CU 160 and a DU 165 such that the CU 160 may support one or more layers of the protocol stack and the DU 165 may support one or more different layers of the protocol stack. In some examples, the CU 160 may host upper protocol layer (e.g., layer 3 (L3), layer 2 (L2)) functionality and signaling (e.g., RRC, service data adaption protocol (SDAP), Packet Data Convergence Protocol (PDCP)). The CU 160 may be connected to one or more DUs 165 or RUs 170, and the one or more DUs 165 or RUs 170 may host lower protocol layers, such as layer 1 (L1) (e.g., physical (PHY) layer) or L2 (e.g., radio link control (RLC) layer, medium access control (MAC) layer) functionality and signaling, and may each be at least partially controlled by the CU 160. Additionally, or alternatively, a functional split of the protocol stack may be employed between a DU 165 and an RU 170 such that the DU 165 may support one or more layers of the protocol stack and the RU 170 may support one or more different layers of the protocol stack. The DU 165 may support one or multiple different cells (e.g., via one or more RUs 170). In some cases, a functional split between a CU 160 and a DU 165, or between a DU 165 and an RU 170 may be within a protocol layer (e.g., some functions for a protocol layer may be performed by one of a CU 160, a DU 165, or an RU 170, while other functions of the protocol layer are performed by a different one of the CU 160, the DU 165, or the RU 170). A CU 160 may be functionally split further into CU control plane (CU-CP) and CU user plane (CU-UP) functions. A CU 160 may be connected to one or more DUs 165 via a midhaul communication link 162 (e.g., F1, F1-c, F1-u), and a DU 165 may be connected to one or more RUs 170 via a fronthaul communication link 168 (e.g., open fronthaul (FH) interface). In some examples, a midhaul communication link 162 or a fronthaul communication link 168 may be implemented in accordance with an interface (e.g., a channel) between layers of a protocol stack supported by respective network entities 105 that are in communication over such communication links.

In wireless communications systems (e.g., wireless communications system 100), infrastructure and spectral resources for radio access may support wireless backhaul link capabilities to supplement wired backhaul connections, providing an IAB network architecture (e.g., to a core network 130). In some cases, in an IAB network, one or more network entities 105 (e.g., IAB nodes 104) may be partially controlled by each other. One or more IAB nodes 104 may be referred to as a donor entity or an IAB donor. One or more DUs 165 or one or more RUs 170 may be partially controlled by one or more CUs 160 associated with a donor network entity 105 (e.g., a donor base station 140). The one or more donor network entities 105 (e.g., IAB donors) may be in communication with one or more additional network entities 105 (e.g., IAB nodes 104) via supported access and backhaul links (e.g., backhaul communication links 120). IAB nodes 104 may include an IAB mobile termination (IAB-MT) controlled (e.g., scheduled) by DUs 165 of a coupled IAB donor. An IAB-MT may include an independent set of antennas for relay of communications with UEs 115, or may share the same antennas (e.g., of an RU 170) of an IAB node 104 used for access via the DU 165 of the IAB node 104 (e.g., referred to as virtual IAB-MT (vIAB-MT)). In some examples, the IAB nodes 104 may include DUs 165 that support communication links with additional entities (e.g., IAB nodes 104, UEs 115) within the relay chain or configuration of the access network (e.g., downstream). In such cases, one or more components of the disaggregated RAN architecture (e.g., one or more IAB nodes 104 or components of IAB nodes 104) may be configured to operate according to the techniques described herein.

In the case of the techniques described herein applied in the context of a disaggregated RAN architecture, one or more components of the disaggregated RAN architecture may be configured to support techniques for implementing RS coding as described herein. For example, some operations described as being performed by a UE 115 or a network entity 105 (e.g., a base station 140) may additionally, or alternatively, be performed by one or more components of the disaggregated RAN architecture (e.g., IAB nodes 104, DUs 165, CUs 160, RUs 170, RIC 175, SMO 180).

A UE 115 may include or may be referred to as a mobile device, a wireless device, a remote device, a handheld device, or a subscriber device, or some other suitable terminology, where the "device" may also be referred to as a unit, a station, a terminal, or a client, among other examples. A UE 115 may also include or may be referred to as a personal electronic device such as a cellular phone, a personal digital assistant (PDA), a tablet computer, a laptop computer, or a personal computer. In some examples, a UE 115 may include or be referred to as a wireless local loop (WLL) station, an Internet of Things (IoT) device, an Internet of Everything (IoE) device, or a machine type communications (MTC) device, among other examples, which may be implemented in various objects such as appliances, or vehicles, meters, among other examples.

The UEs 115 described herein may be able to communicate with various types of devices, such as other UEs 115 that may sometimes act as relays as well as the network entities 105 and the network equipment including macro eNBs or gNBs, small cell eNBs or gNBs, or relay base stations, among other examples, as shown in FIG. 1.

The UEs 115 and the network entities 105 may wirelessly communicate with one another via one or more communication links 125 (e.g., an access link) over one or more carriers. The term "carrier" may refer to a set of RF spectrum resources having a defined physical layer structure for supporting the communication links 125. For example, a carrier used for a communication link 125 may include a portion of a RF spectrum band (e.g., a bandwidth part (BWP)) that is operated according to one or more physical layer channels for a given radio access technology (e.g., LTE, LTE-A, LTE-A Pro, NR). Each physical layer channel may carry acquisition signaling (e.g., synchronization signals, system information), control signaling that coordinates operation for the carrier, user data, or other signaling. The wireless communications system 100 may support communication with a UE 115 using carrier aggregation or multi-carrier operation. A UE 115 may be configured with multiple downlink component carriers and one or more uplink component carriers according to a carrier aggregation configuration. Carrier aggregation may be used with both frequency division duplexing (FDD) and time division duplexing (TDD) component carriers. Communication between a network entity 105 and other devices may refer to communication between the devices and any portion (e.g., entity, sub-entity) of a network entity 105. For example, the terms "transmitting," "receiving," or "communicating," when referring to a network entity 105, may refer to any portion of a network entity 105 (e.g., a base station 140, a CU 160, a DU 165, a RU 170) of a RAN communicating with another device (e.g., directly or via one or more other network entities 105).

Signal waveforms transmitted over a carrier may be made up of multiple subcarriers (e.g., using multi-carrier modulation (MCM) techniques such as orthogonal frequency division multiplexing (OFDM) or discrete Fourier transform spread OFDM (DFT-S-OFDM)). In a system employing MCM techniques, a resource element may refer to resources of one symbol period (e.g., a duration of one modulation symbol) and one subcarrier, in which case the symbol period and subcarrier spacing may be inversely related. The quantity of bits carried by each resource element may depend on the modulation scheme (e.g., the order of the modulation scheme, the coding rate of the modulation scheme, or both) such that the more resource elements that a device receives and the higher the order of the modulation scheme, the higher the data rate may be for the device. A wireless communications resource may refer to a combination of an RF spectrum resource, a time resource, and a spatial resource (e.g., a spatial layer, a beam), and the use of multiple spatial resources may increase the data rate or data integrity for communications with a UE 115.

The time intervals for the network entities 105 or the UEs 115 may be expressed in multiples of a basic time unit which may, for example, refer to a sampling period of $T_s=1/(\Delta f_{max} \cdot N_f)$ seconds, where $\Delta f_{max}$ may represent the maximum supported subcarrier spacing, and $N_f$ may represent the maximum supported discrete Fourier transform (DFT) size. Time intervals of a communications resource may be organized according to radio frames each having a specified duration (e.g., 10 milliseconds (ms)). Each radio frame may be identified by a system frame number (SFN) (e.g., ranging from 0 to 1023).

Each frame may include multiple consecutively numbered subframes or slots, and each subframe or slot may have the same duration. In some examples, a frame may be divided (e.g., in the time domain) into subframes, and each subframe may be further divided into a quantity of slots. Alternatively, each frame may include a variable quantity of slots, and the quantity of slots may depend on subcarrier spacing. Each slot may include a quantity of symbol periods (e.g., depending on the length of the cyclic prefix prepended to each symbol period). In some wireless communications systems 100, a slot may further be divided into multiple mini-slots containing one or more symbols. Excluding the cyclic prefix, each symbol period may contain one or more (e.g., $N_f$) sampling periods. The duration of a symbol period may depend on the subcarrier spacing or frequency band of operation.

A subframe, a slot, a mini-slot, or a symbol may be the smallest scheduling unit (e.g., in the time domain) of the wireless communications system 100 and may be referred to as a transmission time interval (TTI). In some examples, the TTI duration (e.g., a quantity of symbol periods in a TTI) may be variable. Additionally, or alternatively, the smallest scheduling unit of the wireless communications system 100 may be dynamically selected (e.g., in bursts of shortened TTIs (sTTIs)).

Physical channels may be multiplexed on a carrier according to various techniques. A physical control channel and a physical data channel may be multiplexed on a downlink carrier, for example, using one or more of time division multiplexing (TDM) techniques, frequency division multiplexing (FDM) techniques, or hybrid TDM-FDM techniques. A control region (e.g., a control resource set (CORESET)) for a physical control channel may be defined by a set of symbol periods and may extend across the system bandwidth or a subset of the system bandwidth of the carrier. One or more control regions (e.g., CORESETs) may be configured for a set of the UEs 115. For example, one or more of the UEs 115 may monitor or search control regions for control information according to one or more search space sets, and each search space set may include one or multiple control channel candidates in one or more aggregation levels arranged in a cascaded manner. An aggregation level for a control channel candidate may refer to an amount of control channel resources (e.g., control channel elements (CCEs)) associated with encoded information for a control information format having a given payload size. Search space sets may include common search space sets configured for sending control information to multiple UEs 115 and UE-specific search space sets for sending control information to a specific UE 115.

In some examples, a network entity 105 (e.g., a base station 140, an RU 170) may be movable and therefore provide communication coverage for a moving coverage area 110. In some examples, different coverage areas 110 associated with different technologies may overlap, but the different coverage areas 110 may be supported by the same network entity 105. In some other examples, the overlapping coverage areas 110 associated with different technologies may be supported by different network entities 105. The wireless communications system 100 may include, for example, a heterogeneous network in which different types of the network entities 105 provide coverage for various coverage areas 110 using the same or different radio access technologies.

The wireless communications system 100 may be configured to support ultra-reliable communications or low-latency communications, or various combinations thereof. For example, the wireless communications system 100 may be configured to support ultra-reliable low-latency communications (URLLC). The UEs 115 may be designed to support ultra-reliable, low-latency, or critical functions. Ultra-reliable communications may include private communication or group communication and may be supported by one or more services such as push-to-talk, video, or data. Support for ultra-reliable, low-latency functions may include prioritization of services, and such services may be used for public safety or general commercial applications. The terms ultra-reliable, low-latency, and ultra-reliable low-latency may be used interchangeably herein.

In some examples, a UE 115 may be able to communicate directly with other UEs 115 over a device-to-device (D2D) communication link 135 (e.g., in accordance with a peer-to-peer (P2P), D2D, or sidelink protocol). In some examples, one or more UEs 115 of a group that are performing D2D communications may be within the coverage area 110 of a network entity 105 (e.g., a base station 140, an RU 170), which may support aspects of such D2D communications being configured by or scheduled by the network entity 105. In some examples, one or more UEs 115 in such a group may be outside the coverage area 110 of a network entity 105 or may be otherwise unable to or not configured to receive transmissions from a network entity 105. In some examples, groups of the UEs 115 communicating via D2D communications may support a one-to-many (1:M) system in which each UE 115 transmits to each of the other UEs 115 in the group. In some examples, a network entity 105 may facilitate the scheduling of resources for D2D communications. In some other examples, D2D communications may be carried out between the UEs 115 without the involvement of a network entity 105.

The core network 130 may provide user authentication, access authorization, tracking, Internet Protocol (IP) connectivity, and other access, routing, or mobility functions. The core network 130 may be an evolved packet core (EPC) or 5G core (5GC), which may include at least one control plane entity that manages access and mobility (e.g., a mobility management entity (MME), an access and mobility management function (AMF)) and at least one user plane entity that routes packets or interconnects to external networks (e.g., a serving gateway (S-GW), a Packet Data Network (PDN) gateway (P-GW), or a user plane function (UPF)). The control plane entity may manage non-access stratum (NAS) functions such as mobility, authentication, and bearer management for the UEs 115 served by the network entities 105 (e.g., base stations 140) associated with the core network 130. User IP packets may be transferred through the user plane entity, which may provide IP address allocation as well as other functions. The user plane entity may be connected to IP services 150 for one or more network operators. The IP services 150 may include access to the Internet, Intranet(s), an IP Multimedia Subsystem (IMS), or a Packet-Switched Streaming Service.

The wireless communications system 100 may operate using one or more frequency bands, which may be in the range of 300 megahertz (MHz) to 300 gigahertz (GHz). Generally, the region from 300 MHz to 3 GHz is known as the ultra-high frequency (UHF) region or decimeter band because the wavelengths range from approximately one decimeter to one meter in length. The UHF waves may be blocked or redirected by buildings and environmental features, which may be referred to as clusters, but the waves may penetrate structures sufficiently for a macro cell to provide service to the UEs 115 located indoors. The transmission of UHF waves may be associated with smaller antennas and shorter ranges (e.g., less than 100 kilometers) compared to transmission using the smaller frequencies and longer waves of the high frequency (HF) or very high frequency (VHF) portion of the spectrum below 300 MHz.

The wireless communications system 100 may utilize both licensed and unlicensed RF spectrum bands. For example, the wireless communications system 100 may employ License Assisted Access (LAA), LTE-Unlicensed (LTE-U) radio access technology, or NR technology in an unlicensed band such as the 5 GHz industrial, scientific, and medical (ISM) band. While operating in unlicensed RF spectrum bands, devices such as the network entities 105 and the UEs 115 may employ carrier sensing for collision detection and avoidance. In some examples, operations in unlicensed bands may be based on a carrier aggregation configuration in conjunction with component carriers operating in a licensed band (e.g., LAA). Operations in unlicensed spectrum may include downlink transmissions, uplink transmissions, P2P transmissions, or D2D transmissions, among other examples.

A network entity 105 (e.g., a base station 140, an RU 170) or a UE 115 may be equipped with multiple antennas, which may be used to employ techniques such as transmit diversity, receive diversity, multiple-input multiple-output (MIMO) communications, or beamforming. The antennas of a network entity 105 or a UE 115 may be located within one or more antenna arrays or antenna panels, which may support MIMO operations or transmit or receive beamforming. For example, one or more base station antennas or antenna arrays may be co-located at an antenna assembly, such as an antenna tower. In some examples, antennas or antenna arrays associated with a network entity 105 may be located in diverse geographic locations. A network entity 105 may have an antenna array with a set of rows and columns of antenna ports that the network entity 105 may use to support beamforming of communications with a UE 115. Likewise, a UE 115 may have one or more antenna arrays that may support various MIMO or beamforming operations. Additionally, or alternatively, an antenna panel may support RF beamforming for a signal transmitted via an antenna port.

The network entities 105 or the UEs 115 may use MIMO communications to exploit multipath signal propagation and increase the spectral efficiency by transmitting or receiving multiple signals via different spatial layers. Such techniques may be referred to as spatial multiplexing. The multiple signals may, for example, be transmitted by the transmitting device via different antennas or different combinations of antennas. Likewise, the multiple signals may be received by the receiving device via different antennas or different combinations of antennas. Each of the multiple signals may be referred to as a separate spatial stream and may carry information associated with the same data stream (e.g., the same codeword) or different data streams (e.g., different codewords). Different spatial layers may be associated with different antenna ports used for channel measurement and reporting. MIMO techniques include single-user MIMO (SU-MIMO), where multiple spatial layers are transmitted to the same receiving device, and multiple-user MIMO (MU-MIMO), where multiple spatial layers are transmitted to multiple devices.

Beamforming, which may also be referred to as spatial filtering, directional transmission, or directional reception, is a signal processing technique that may be used at a transmitting device or a receiving device (e.g., a network entity 105, a UE 115) to shape or steer an antenna beam (e.g., a transmit beam, a receive beam) along a spatial path between the transmitting device and the receiving device. Beamforming may be achieved by combining the signals communicated via antenna elements of an antenna array such that some signals propagating at particular orientations with respect to an antenna array experience constructive interference while others experience destructive interference. The adjustment of signals communicated via the antenna elements may include a transmitting device or a receiving device applying amplitude offsets, phase offsets, or both to signals carried via the antenna elements associated with the device. The adjustments associated with each of the antenna elements may be defined by a beamforming weight set associated with a particular orientation (e.g., with respect to the antenna array of the transmitting device or receiving device, or with respect to some other orientation).

A network entity 105 or a UE 115 may use beam sweeping techniques as part of beamforming operations. For example, a network entity 105 (e.g., a base station 140, an RU 170) may use multiple antennas or antenna arrays (e.g., antenna panels) to conduct beamforming operations for directional communications with a UE 115. Some signals (e.g., synchronization signals, reference signals, beam selection signals, or other control signals) may be transmitted by a network entity 105 multiple times along different directions. For example, the network entity 105 may transmit a signal according to different beamforming weight sets associated with different directions of transmission. Transmissions along different beam directions may be used to identify (e.g., by a transmitting device, such as a network entity 105, or by a receiving device, such as a UE 115) a beam direction for later transmission or reception by the network entity 105.

Some signals, such as data signals associated with a particular receiving device, may be transmitted by transmitting device (e.g., a transmitting network entity 105, a transmitting UE 115) along a single beam direction (e.g., a direction associated with the receiving device, such as a receiving network entity 105 or a receiving UE 115). In some examples, the beam direction associated with transmissions along a single beam direction may be determined based on a signal that was transmitted along one or more beam directions. For example, a UE 115 may receive one or more of the signals transmitted by the network entity 105 along different directions and may report to the network entity 105 an indication of the signal that the UE 115 received with a highest signal quality or an otherwise acceptable signal quality.

In some examples, transmissions by a device (e.g., by a network entity 105 or a UE 115) may be performed using multiple beam directions, and the device may use a combination of digital precoding or beamforming to generate a combined beam for transmission (e.g., from a network entity 105 to a UE 115). The UE 115 may report feedback that indicates precoding weights for one or more beam directions, and the feedback may correspond to a configured set of beams across a system bandwidth or one or more subbands. The network entity 105 may transmit a reference signal (e.g., a cell-specific reference signal (CRS), a channel state information reference signal (CSI-RS)), which may be precoded or unprecoded. The UE 115 may provide feedback for beam selection, which may be a precoding matrix indicator (PMI) or codebook-based feedback (e.g., a multipanel type codebook, a linear combination type codebook, a port selection type codebook). Although these techniques are described with reference to signals transmitted along one or more directions by a network entity 105 (e.g., a base station 140, an RU 170), a UE 115 may employ similar techniques for transmitting signals multiple times along different directions (e.g., for identifying a beam direction for subsequent transmission or reception by the UE 115) or for transmitting a signal along a single direction (e.g., for transmitting data to a receiving device).

A receiving device (e.g., a UE 115) may perform reception operations in accordance with multiple receive configurations (e.g., directional listening) when receiving various signals from a receiving device (e.g., a network entity 105), such as synchronization signals, reference signals, beam selection signals, or other control signals. For example, a receiving device may perform reception in accordance with multiple receive directions by receiving via different antenna subarrays, by processing received signals according to different antenna subarrays, by receiving according to different receive beamforming weight sets (e.g., different directional listening weight sets) applied to signals received at multiple antenna elements of an antenna array, or by processing received signals according to different receive beamforming weight sets applied to signals received at multiple antenna elements of an antenna array, any of which may be referred to as "listening" according to different receive configurations or receive directions. In some examples, a receiving device may use a single receive configuration to receive along a single beam direction (e.g., when receiving a data signal). The single receive configuration may be aligned along a beam direction determined based on listening according to different receive configuration directions (e.g., a beam direction determined to have a highest signal strength, highest signal-to-noise ratio (SNR), or otherwise acceptable signal quality based on listening according to multiple beam directions).

The wireless communications system 100 may be a packet-based network that operates according to a layered protocol stack. In the user plane, communications at the bearer or PDCP layer may be IP-based. An RLC layer may perform packet segmentation and reassembly to communicate over logical channels. A MAC layer may perform priority handling and multiplexing of logical channels into transport channels. The MAC layer may also use error detection techniques, error correction techniques, or both to support retransmissions at the MAC layer to improve link efficiency. In the control plane, the RRC protocol layer may provide establishment, configuration, and maintenance of an RRC connection between a UE 115 and a network entity 105 or a core network 130 supporting radio bearers for user plane data. At the PHY layer, transport channels may be mapped to physical channels.

The UEs 115 and the network entities 105 may support retransmissions of data to increase the likelihood that data is received successfully. Hybrid automatic repeat request (HARQ) feedback is one technique for increasing the likelihood that data is received correctly over a communication link (e.g., a communication link 125, a D2D communication link 135). HARQ may include a combination of error detection (e.g., using a cyclic redundancy check (CRC)), forward error correction (FEC), and retransmission (e.g., automatic repeat request (ARQ)). HARQ may improve throughput at the MAC layer in poor radio conditions (e.g., low signal-to-noise conditions). In some examples, a device may support same-slot HARQ feedback, where the device may provide HARQ feedback in a specific slot for data received in a previous symbol in the slot. In some other examples, the device may provide HARQ feedback in a subsequent slot, or according to some other time interval.

In some examples, a UE 115 and a network entity 105 may communicate information to one another. The network entity 105 may encode and modulate the information in a message using a modulation scheme and coding scheme. In some examples, the network entity 105 may encode the message by assigning information bits to channels (e.g., channels in a channel constellation). The network entity 105 may modulate the message by adjusting a phase, frequency, amplitude, or a combination thereof and may then perform encoding of the message. The network entity 105 may transmit the message to the UE 115, and in some examples, the message may include a codeword containing the encoded information (e.g., encoded information bits). The UE 115 may receive the message via a communication link 125, and the UE 115 may apply demodulation schemes and decoding schemes to the codeword included in the message. The UE 115 may perform demodulation schemes by reversing the adjustment of the modulation scheme performed by the network entity 105 by determining the adjustment using a likelihood demodulation. The demodulation schemes may include a maximum likelihood (ML) demodulation, a near ML demodulation, a minimum mean square error (MMSE) demodulation, or a combination thereof. The role of the demodulator may be to separate the different streams of the MIMO and calculate the LLRs of all the bits in the different layers. MMSE demodulation may be referred to as a simple demodulation method such as compared to ML demodulation, which may be referred as a complicated demodulation technique. For example, ML demodulation may take into account all options and then choose the optimal option. Near ML demodulation may not take into account all options but the performance is close enough to the actual solution while reducing complexity that near ML demodulation may represent a practical demodulation technique.

Accordingly, a UE 115 may use a near ML demodulator to demodulate the message prior to decoding. The near ML demodulator may output a ratio, such as log-likelihood ratios (LLRs) which may represent an error probability. LLRs may indicate a demodulated bit value and a likelihood that the bit value is correct. In some examples, such as high throughput scenarios (e.g., a large number of layers, large channel constellation, high code rate, high signal-to-noise ratio (SNR), etc.), near ML demodulation may be more affected by LLR bias than MMSE demodulation or ML demodulation. In some cases, MMSE and ML demodulation may not be impacted by LLR bias. As such, a near ML demodulator may output an incorrect demodulated bit value (e.g., an LLR with a wrong sign) and due to the LLR bias, the near ML demodulator may incorrectly demodulate the bit value with a high confidence that the bit value is correct (e.g., a near ML demodulator may output LLRs that are biased given that an error was made). The probability of biased LLRs may increase for high throughout scenarios (e.g., large constellation and high correlation).

In some examples, decoding schemes may be associated with soft decoders (e.g., a low-density parity-check (LDPC) decoder), hard decoders, (e.g., a RS decoder), or a combination thereof. Soft decoders may be associated with approximating a range of possible bit values between 0 and 1, whereas hard decoders may be associated with estimating a bit value of either 0 or 1. In this example, soft decoders, such as an LDPC decoder, may propagate the errors associated with the high throughput scenario due to the LLR bias, as values in the middle range (e.g., approximately 0.5) may be adjusted to be less than 0.5 or more than 0.5. As such, rather than catching and fixing the errors, the LDPC decoder may cause an error burst due to the binary nature of the decoder. The LDPC decoder may produce error bursts of up to m bits (e.g., 8 bits), where m may be the number of bits in the channel constellation.

For example, MMSE demodulation may output wrong guesses but may assign a confidence that is small so the decoder may recognize that additional processing should be performed to identify the correct bit. However, with near ML demodulation and in high throughput scenarios, the near ML demodulator may output a wrong bit value with a high confidence that the bit value is correct. Accordingly, the decoder may perform less processing than the decoder should have due to the high confidence level. This situation is likely to result in an increased number of errors compared to MMSE demodulation.

In one example of the near ML demodulator being impacted by LLR bias due to high throughout, different constellations may result in a different number of bits per symbol. For example, 256 QAM may result in 8 bits per symbol. During demodulation, a demodulator may make a joint decision based on those 8 bits and if there are several layers, then the joint decision for those bits may be applied on all the layers. Therefore when a demodulator makes a joint decision, and if the LLR is biased, then the error may impact many bits (e.g., bursts of bits), such that a burst of errors may result. Some decoders, such as an LDPC decoder, may assume that there is no correlation between errors which is not the case when there is high constellation and a high number of layers. In some cases, the higher the SNR, the higher the values of the LLRs. The LLRs may be capped at a threshold because after a certain point, the LLR may not provide additional information. For example, an LLR of 10 may indicate just as much as an LLR of 1000. Clipping the LLRs may result in less soft information (less variation between the LLRs). So while soft decoders may result in increased performance than hard decoders, the difference between soft and hard decoders may be less apparent at high SNR because many LLRs are clipped.

Therefore, in high throughput scenarios, the UE 115 may be unable to correctly demodulate and decode the message (e.g., the UE 115 may be less close to the ML solution). The inability of the UE 115 to correctly demodulate and decode the message may result in a greater amount of errors at high code rates due to the successive nature of the near ML demodulator. For example, the near ML demodulator may demodulate a bit based on the value of a previous bit, and if the near ML demodulator is affected by LLR bias, the demodulator may incorrectly demodulate several bits based on incorrect single bit. Additionally, LDPC decoders may result in high power consumption and performance degradation at the UE 115 due to high error propagation when applying near ML demodulation in high throughout scenarios. Specifically, in a scenario with high SNR, a majority of the LLRs may not be decoded (e.g., the LLRs may be clipped), which may result in a loss of information bits (e.g., less soft information).

A near ML demodulator may result in improved performance, throughput-wise, than the MMSE demodulator. It can also be seen that at low rates, the LDPC code may result in better performance than an RS code but at high constellation, for example, the opposite is true such that the near ML RS combination results in high throughout while also achieving reduced power consumption. Therefore, the features described herein generally relate to implementing RS coding techniques to improve reliability and reduce latency in a wireless communications network. Additionally, the features described herein relate to identifying situations in which the LDPC codes may result in reduced performance and to implement the RS code for such cases.

For example, the UE 115 may use an RS decoder to improve throughput and power consumption in high throughput scenarios and based on the UE 115 using near ML demodulation. Specifically, during high throughput scenarios, the RS decoder may decode the message with a relatively lower complexity and a reduced power consumption in comparison with the LDPC decoder. While typically an LDPC decoder may be more robust than an RS decoder, the RS decoder may result in improved performance during high throughput compared to the LDPC decoder (e.g., using the RS decoder may result in a 10%/1.5 dB gain compared to the LDPC decoder at 256 QAM).

In some cases, the UE 115 may report to a network entity 105 whether the UE 115 has RS decoding capability, near ML demodulation capability, or both, as part of a capability report, for example. In some examples, the UE 115 may request for to the network entity 105 to implement RS coding techniques for one or more scheduled signals, such as if the UE 115 detects a high throughout scenario. In some examples, the network entity 105 may transmit an indication to the UE 115 indicating whether the UE 115 is to use RS decoding, or some other decoding technique by transmitting DCI, a RRC configuration, a MAC-CE, or a combination thereof including the indication. Accordingly, a network entity 105 may indicate, to a UE 115, a coding scheme (e.g., RS decoding, LDPC decoding) applied to one or more scheduled signals, the network entity 105 may apply the indicated coding scheme to the one or more signals, and the network entity 105 may transmit the coded signals to the UE 115. Upon receiving the coded signals, the UE 115 may apply near ML demodulation and the indicated decoding scheme to the received signals to identify the information included in the signals.

Figure 2:
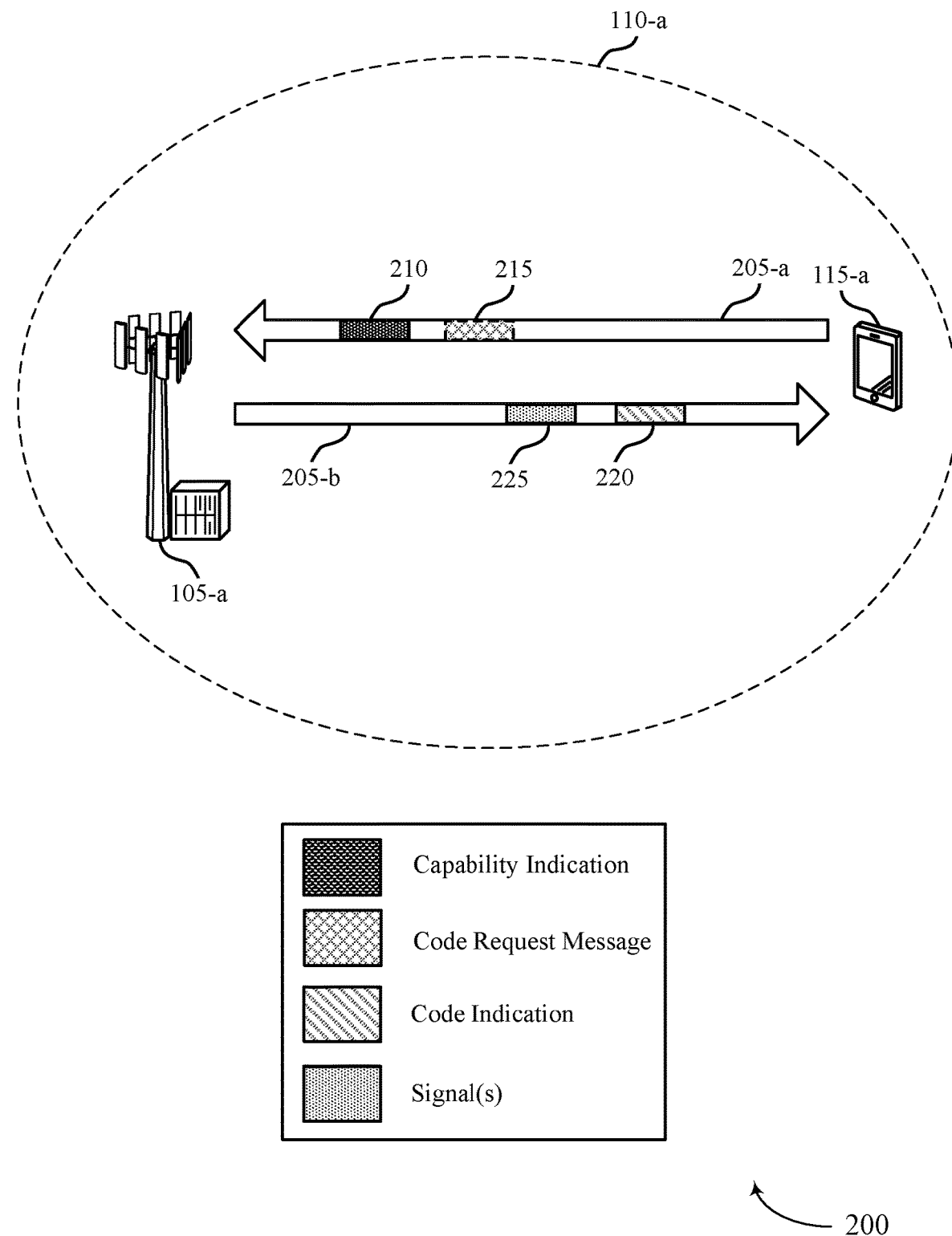
FIG. 2 illustrates an example of a wireless communications system that supports techniques for implementing RS coding in accordance with one or more aspects of the present disclosure.

FIG. 2 illustrates an example of a wireless communications system 200 that supports techniques for implementing RS coding in accordance with one or more aspects of the present disclosure. In some examples, wireless communications system 200 may implement aspects of wireless communications system 100 and may include a UE 115-a and a network entity 105-a serving a coverage area 110-a, which may be examples of a UE 115 and a network entity 105 serving a coverage area 110 as described with reference to FIG. 1. The network entity 105-a and the UE 115-a may communicate with one another via a communications link 205-a (e.g., an uplink communications link, a beam, a channel), a communications link 205-b (e.g., a downlink communications link, a beam, a channel), or both.

The features described herein generally relate to implementing RS coding techniques to improve reliability and reduce latency (e.g., enable the use of RS code instead of LDPC code in high throughput scenarios, for example). For example, the UE 115-a may use an RS decoder to improve throughput and power consumption in high throughput scenarios and based on the UE 115-a using near ML demodulation. Specifically, during high throughput scenarios, the RS decoder at the UE 115-a may decode the message with a relatively lower complexity and a reduced power consumption in comparison with the LDPC decoder and while typically an LDPC decoder may be more robust than an RS decoder, the RS decoder may result in improved performance during high throughput compared to the LDPS decoder, as described in more detail with reference to FIG. 1.

In some cases, the UE 115-a may report to a network entity 105-a whether the UE 115-a has RS decoding capability, near ML demodulation capability, or both. The UE 115-a may report the decoding capability by transmitting a capability report (e.g., capability indication 210) via communications link 205-a. The UE 115-a may transmit the capability indication 210 upon connecting with the network entity 105-a, upon receiving a request to transmit the capability indication 210, or the UE 115-a may autonomously determine to transmit the capability indication 210.

In some examples, the UE 115-a may request for the network entity 105-a to implement a particular coding technique (e.g., RS coding, LDPC coding, or some other coding technique) for one or more scheduled signals 225 by transmitting a code request message 215 via communications link 205-a. For example, the UE 115-a may request for the network entity 105-a to implement RS coding techniques for one or more scheduled signals 225 by transmitting a code request message 215 via communications link 205-a. In some cases, the UE 115-a may request RS coding be applied to a certain set of one or more signals, for a certain resource range (e.g., time range, frequency range), or just generally request that RS coding be applied for communications with the UE 115-a. In some examples, the UE 115-a may transmit the code request message 215 in uplink control information (UCI) as part of a channel state information (CSI) report. Additionally, or alternatively, the UE 115-a may transmit the request via an RRC message, a MAC-CE message, etc. In some cases, the code request message 215 may indicate (e.g., implicitly, or explicitly) that the UE 115-a has RS decoding capability and near ML demodulation capability. For example, if the UE 115-a transmits the request for RS coding to be applied to one or more signals, the network entity 105-a may implicitly determine that the UE 115-a is capable of RS decoding and near ML demodulation. In another example, the code request message 215 may include the capability indication, or vice versa (e.g., an explicit indication of UE capability).

In some cases, the UE 115-a may transmit the code request message 215 based on one or more communication parameters associated with the UE 115-a. For example, the UE 115-a may detect a high throughout scenario, high power consumption, reduced capability (e.g., low battery), etc. The high throughput scenario may include one or more of a high SNR, a large constellation, a high code rate, a large number of layers, or a rank. Upon detecting the UE 115-a is operating in or is likely about to operate in such a scenario, the UE 115-a may transmit a code request message 215 including a request for RS coding to be applied. In some cases, the UE 115-a may detect that the UE 115-a is not operating in a high throughout and/or high power consumption scenario and may transmit a code request message 215 including a request for LDPC coding to be applied.

The network entity 105-a may determine a coding technique to apply for communications with the UE 115-a. The determination may be based on the capability of the UE 115-a (e.g., RS decoding capability, near ML demodulation capability), based on a request from the UE 115-a, based on throughout scenario, power consumption scenario, etc. In some cases, the network entity 105-a may determine that the UE 115-a is operating under or may enter into a high throughput, and/or a high power consumption scenario. In such cases, the network entity 105-a may determine to apply RS coding to communications with the UE 115-a. Alternatively, the network entity 105-a may determine that the UE 115-a is operating under or may enter into a reduced throughput (e.g., normal throughout, manageable throughput, average throughput), and/or a reduced power consumption scenario (e.g., normal consumption, manageable consumption, average consumption). In such cases, the network entity 105-a may determine to apply LDPC coding to communications with the UE 115-a. In some implementations, the network entity 105-a may determine the coding technique to apply irrespective (e.g., regardless) of the throughput and/or power consumption scenario at the UE 115-a, and/or irrespective of a request by the UE 115-a. For example, a request by the UE 115-a may outweigh (e.g., trump, be prioritized over) a throughput and/or power consumption scenario determined by network entity 105-a. Alternatively, a throughout and/or power consumption scenario determined by network entity 105-a may outweigh (e.g., trump, be prioritized over) a request by the UE 115-a.

Upon determining a code to apply, the network entity 105-a may transmit an indication of a code applied to one or more signals (e.g., code indication 220) via communications link 205-b to the UE 115-a. The code indication 220 may indicate whether the UE 115-a is to use RS decoding, LDPC decoding, or some other decoding technique. In some cases, the network entity 105-b may transmit DCI, a RRC configuration, a MAC-CE, or a combination thereof including the indication. In some cases, the code indication 220 may indicate that a certain code is applied to a certain set of one or more scheduled signals, to signals with a certain frequency range (e.g., time range, frequency range), etc.

Accordingly, the network entity 105-a may indicate, to the UE 115-a, a coding scheme (e.g., RS decoding or LDPC decoding) applied to one or more scheduled signals 225 for the UE 115-a. The network entity 105-a may apply the indicated coding scheme to the one or more signals 225, and the network entity 105-a may transmit the signals 225 to the UE 115-a via communication link 205-b. In some cases, the network entity 105-a may transmit the signals 225 on a shared channel (e.g., a physical downlink shared channel (PDSCH)), a control channel (e.g., a physical downlink control channel (PDCCH)), etc. Upon receiving the signals 225, the UE 115-a may apply near ML demodulation and the indicated decoding scheme to the received signals 225 to identify the information bits included in the signals 225.

Figure 3:
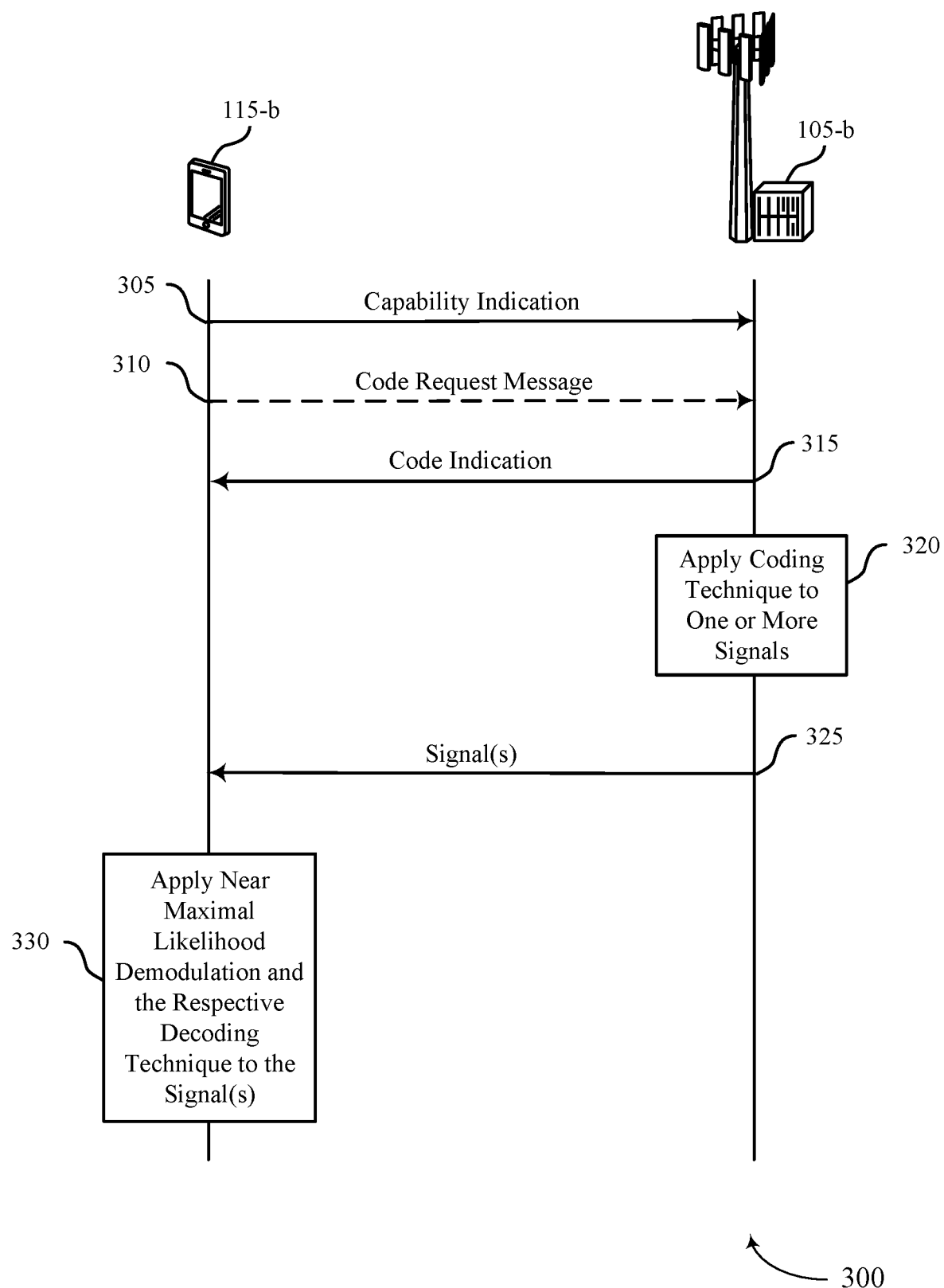
FIG. 3 illustrates an example of a process flow that supports techniques for implementing RS coding in accordance with one or more aspects of the present disclosure.

FIG. 3 illustrates an example of a process flow 300 that supports techniques for implementing RS coding in accordance with one or more aspects of the present disclosure. In some examples, the process flow 300 may implement or be implemented by aspects of a wireless communications system 100 and a wireless communications system 200. For example, the process flow 300 may be implemented by a network entity 105-b and a UE 115-b which may be examples of a network entity 105 and a UE 115 as described with reference to FIGS. 1 and 2. Alternative examples of the following may be implemented, where some steps are performed in a different order then described or are not performed at all. In some cases, steps may include additional features not mentioned below, or further steps may be added.

At 305, the UE 115-b may transmit an indication to the network entity 105-b that the UE 115-b is capable of decoding RS codes and that the UE 115-b is capable of performing near maximal likelihood demodulation. In some examples, the UE 115-b may transmit a RRC message, a MAC-CE message, or an uplink control information message comprising the indication that the UE is capable of decoding RS codes and that the UE is capable of performing near maximal likelihood demodulation.

At 310, in some examples, the UE 115-b may transmit a request to the network entity 105-b for the RS code to be applied to the one or more scheduled signals. In some examples, the UE 115-b may transmit the request with or separate from the indication that the UE 115-b is capable of decoding RS codes and that the UE 115-b is capable of performing near maximal likelihood demodulation. In some examples, the UE 115-b may transmit a channel state information report including uplink control information, where the UE 115-b may include the request with the uplink control information. In some examples, the UE 115-b, the network entity 105-b, or both may determine that the UE 115-b is operating at high throughput, with high power consumption, or both, where transmitting the request is based on the determination. The high throughput may be associated with a high signal-to-noise ratio (SNR), a large constellation, a high code rate, a large number of layers, a rank, or a combination thereof.

At 315, the network entity 105-b may transmit a message to the UE 115-b indicating a code (e.g., RS code, LDPC code) applied to one or more scheduled signals based on the indication. For example, the network entity 105-b may transmit a message to the UE 115-b indicating that a RS code is applied to one or more scheduled signals based on the indication. In some examples, the network entity 105-b may transmit the message based on receiving the request for the RS code to be applied to the one or more scheduled signals. In some examples, the network entity 105-b may transmit DCI indicating the code (e.g., RS code, LDPC code) applied to the one or more scheduled signals. In some examples, the network entity 105-b may transmit a RRC message indicating the code (e.g., RS code, LDPC code) applied to the one or more scheduled signals. In some examples, the network entity 105-b may transmit a MAC-CE message indicating the code (e.g., RS code, LDPC code) is applied to the one or more scheduled signals.

At 320, the network entity 105-b may apply the indicated coding technique, such as RS coding, to a signal of the one or more scheduled signals based on the message.

At 325, the network entity 105-b may transmit, to the UE 115-b, the encoded signal. In some cases, the network entity 105-b may include the encoded signal in a downlink shared channel transmitted to the UE 115-b.

At 330, the UE 115-b may apply near maximal likelihood demodulation and the indicated decoding technique, such as RS decoding, to a received signal (e.g., the encoded signal) of the one or more scheduled signals based on the message.

In another example, the network entity 105-b may transmit a second message indicating that a Low-Density-Parity Check (LDPC) code is applied to one or more other scheduled signals (e.g., via DCI, an RRC message, a MAC-CE message). Accordingly, the network entity 105-b may apply LDPC coding to the one or more other scheduled signals in accordance with the second message. Accordingly, the UE 115-b may apply the near the maximal likelihood demodulation and LDPC decoding to the one or more other scheduled signals based on the second message. In some examples, the UE 115-b may transmit a request for the RS code to be applied to the one or more other scheduled signals. However, the network entity 105-a may determine to apply LDPC coding to the one or more other scheduled signals irrespective of the request. In such cases, the network entity 105-a may transmit the second message irrespective of the RS code request.

Figure 4:
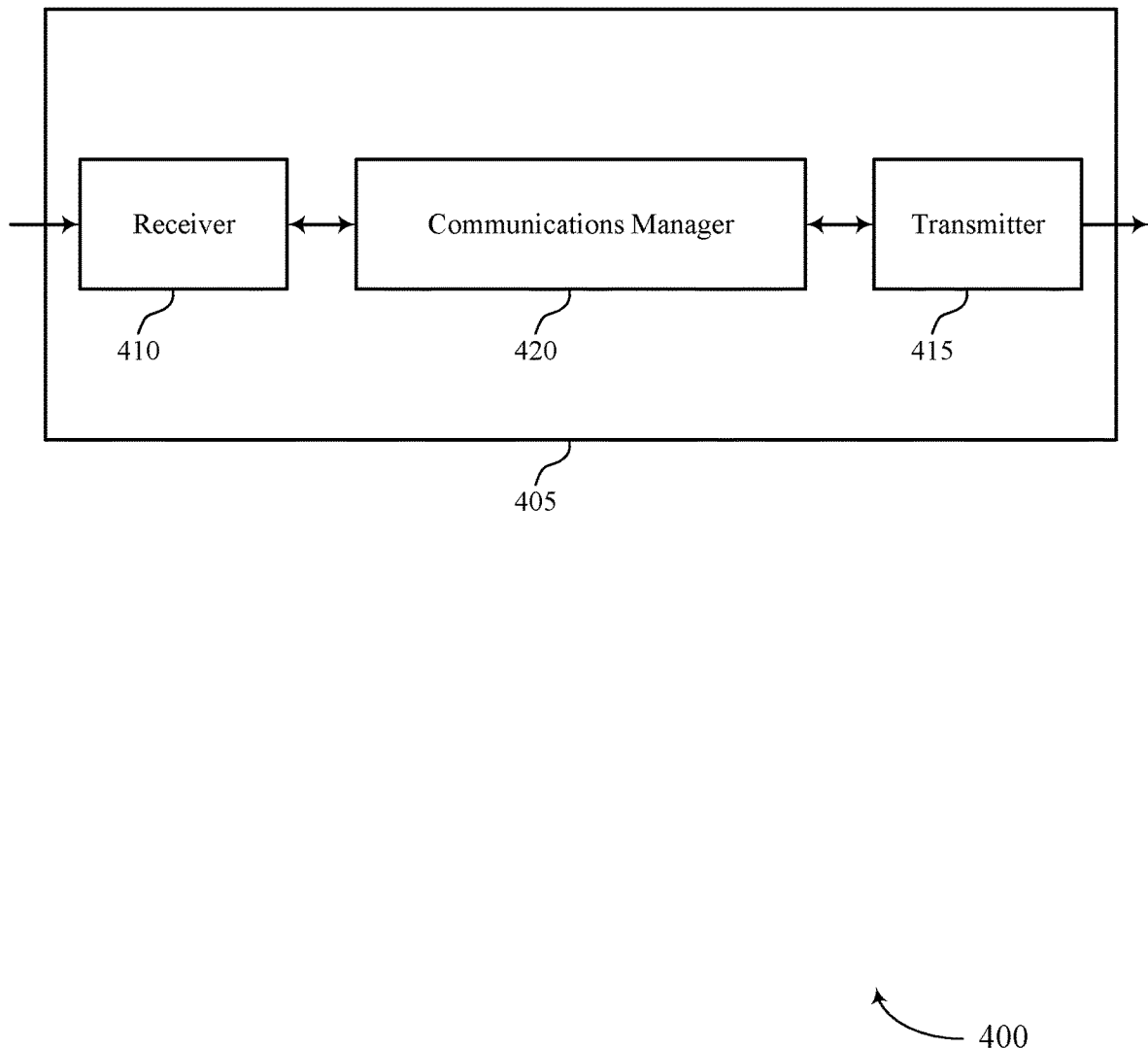
FIGS. 4 and 5 show block diagrams of devices that support techniques for implementing RS coding in accordance with one or more aspects of the present disclosure.

FIG. 4 shows a block diagram 400 of a device 405 that supports techniques for implementing RS coding in accordance with one or more aspects of the present disclosure. The device 405 may be an example of aspects of a UE 115 as described herein. The device 405 may include a receiver 410, a transmitter 415, and a communications manager 420. The device 405 may also include a processor. Each of these components may be in communication with one another (e.g., via one or more buses).

The receiver 410 may provide a means for receiving information such as packets, user data, control information, or any combination thereof associated with various information channels (e.g., control channels, data channels, information channels related to techniques for implementing RS coding). Information may be passed on to other components of the device 405. The receiver 410 may utilize a single antenna or a set of multiple antennas.

The transmitter 415 may provide a means for transmitting signals generated by other components of the device 405. For example, the transmitter 415 may transmit information such as packets, user data, control information, or any combination thereof associated with various information channels (e.g., control channels, data channels, information channels related to techniques for implementing RS coding). In some examples, the transmitter 415 may be co-located with a receiver 410 in a transceiver module. The transmitter 415 may utilize a single antenna or a set of multiple antennas.

The communications manager 420, the receiver 410, the transmitter 415, or various combinations thereof or various components thereof may be examples of means for performing various aspects of techniques for implementing RS coding as described herein. For example, the communications manager 420, the receiver 410, the transmitter 415, or various combinations or components thereof may support a method for performing one or more of the functions described herein.

In some examples, the communications manager 420, the receiver 410, the transmitter 415, or various combinations or components thereof may be implemented in hardware (e.g., in communications management circuitry). The hardware may include a processor, a digital signal processor (DSP), a central processing unit (CPU), an application-specific integrated circuit (ASIC), a field-programmable gate array (FPGA) or other programmable logic device, a microcontroller, discrete gate or transistor logic, discrete hardware components, or any combination thereof configured as or otherwise supporting a means for performing the functions described in the present disclosure. In some examples, a processor and memory coupled with the processor may be configured to perform one or more of the functions described herein (e.g., by executing, by the processor, instructions stored in the memory).

Additionally, or alternatively, in some examples, the communications manager 420, the receiver 410, the transmitter 415, or various combinations or components thereof may be implemented in code (e.g., as communications management software or firmware) executed by a processor. If implemented in code executed by a processor, the functions of the communications manager 420, the receiver 410, the transmitter 415, or various combinations or components thereof may be performed by a general-purpose processor, a DSP, a CPU, an ASIC, an FPGA, a microcontroller, or any combination of these or other programmable logic devices (e.g., configured as or otherwise supporting a means for performing the functions described in the present disclosure).

In some examples, the communications manager 420 may be configured to perform various operations (e.g., receiving, obtaining, monitoring, outputting, transmitting) using or otherwise in cooperation with the receiver 410, the transmitter 415, or both. For example, the communications manager 420 may receive information from the receiver 410, send information to the transmitter 415, or be integrated in combination with the receiver 410, the transmitter 415, or both to obtain information, output information, or perform various other operations as described herein.

The communications manager 420 may support wireless communications at a UE in accordance with examples as disclosed herein. For example, the communications manager 420 may be configured as or otherwise support a means for transmitting an indication that the UE is capable of decoding RS codes and that the UE is capable of performing near maximal likelihood demodulation. The communications manager 420 may be configured as or otherwise support a means for receiving a message indicating that a RS code is applied to one or more scheduled signals based on the indication. The communications manager 420 may be configured as or otherwise support a means for applying near maximal likelihood demodulation and RS decoding to a received signal of the one or more scheduled signals based on the message.

By including or configuring the communications manager 420 in accordance with examples as described herein, the device 405 (e.g., a processor controlling or otherwise coupled with the receiver 410, the transmitter 415, the communications manager 420, or a combination thereof) may support techniques for reduced power consumption and more efficient utilization of communication resources.

Figure 5:
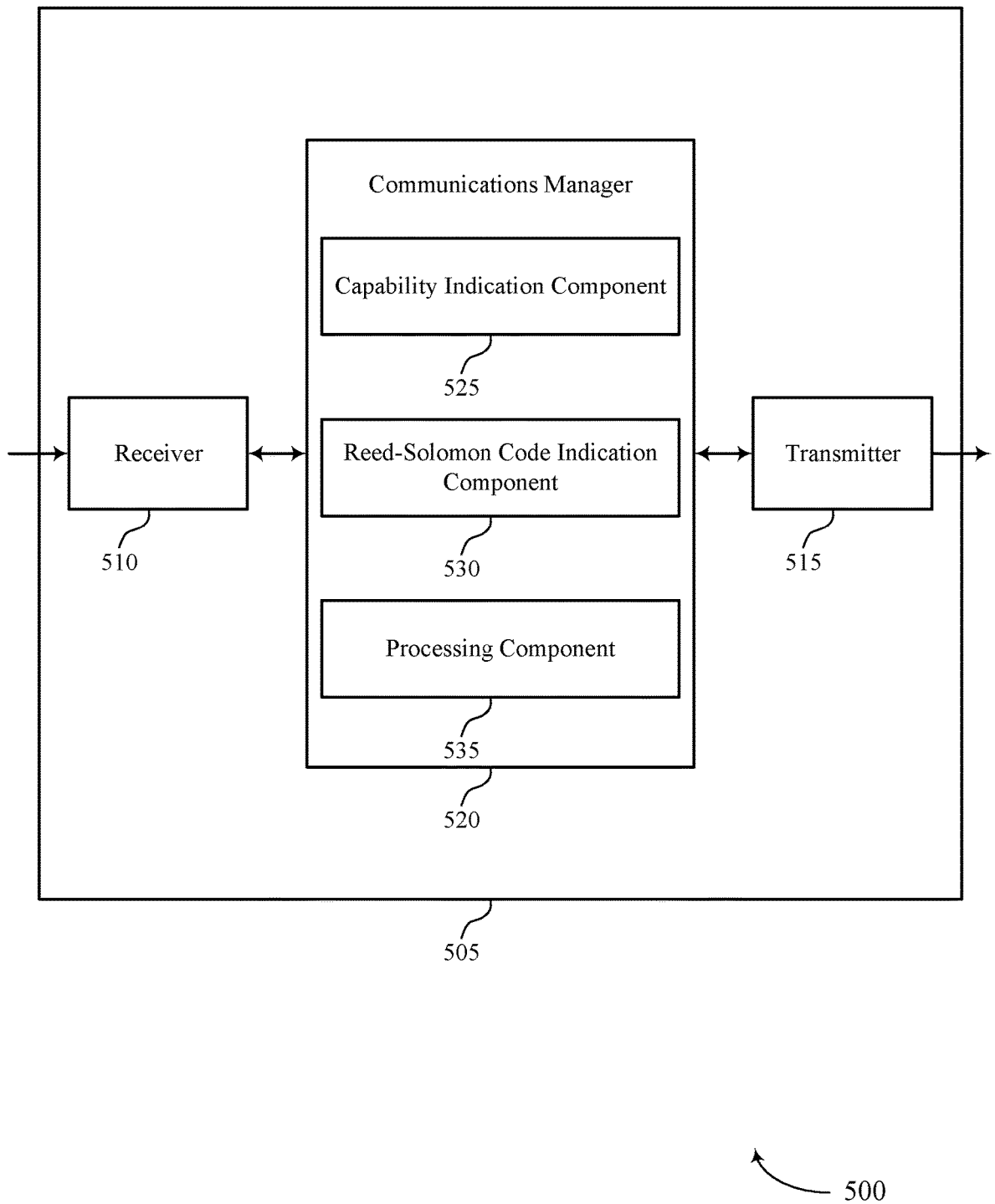

FIG. 5 shows a block diagram 500 of a device 505 that supports techniques for implementing RS coding in accordance with one or more aspects of the present disclosure. The device 505 may be an example of aspects of a device 405 or a UE 115 as described herein. The device 505 may include a receiver 510, a transmitter 515, and a communications manager 520. The device 505 may also include a processor. Each of these components may be in communication with one another (e.g., via one or more buses).

The receiver 510 may provide a means for receiving information such as packets, user data, control information, or any combination thereof associated with various information channels (e.g., control channels, data channels, information channels related to techniques for implementing RS coding). Information may be passed on to other components of the device 505. The receiver 510 may utilize a single antenna or a set of multiple antennas.

The transmitter 515 may provide a means for transmitting signals generated by other components of the device 505. For example, the transmitter 515 may transmit information such as packets, user data, control information, or any combination thereof associated with various information channels (e.g., control channels, data channels, information channels related to techniques for implementing RS coding). In some examples, the transmitter 515 may be co-located with a receiver 510 in a transceiver module. The transmitter 515 may utilize a single antenna or a set of multiple antennas.

The device 505, or various components thereof, may be an example of means for performing various aspects of techniques for implementing RS coding as described herein. For example, the communications manager 520 may include a capability indication component 525, a RS code indication component 530, a processing component 535, or any combination thereof. The communications manager 520 may be an example of aspects of a communications manager 420 as described herein. In some examples, the communications manager 520, or various components thereof, may be configured to perform various operations (e.g., receiving, obtaining, monitoring, outputting, transmitting) using or otherwise in cooperation with the receiver 510, the transmitter 515, or both. For example, the communications manager 520 may receive information from the receiver 510, send information to the transmitter 515, or be integrated in combination with the receiver 510, the transmitter 515, or both to obtain information, output information, or perform various other operations as described herein.

The communications manager 520 may support wireless communications at a UE in accordance with examples as disclosed herein. The capability indication component 525 may be configured as or otherwise support a means for transmitting an indication that the UE is capable of decoding RS codes and that the UE is capable of performing near maximal likelihood demodulation. The RS code indication component 530 may be configured as or otherwise support a means for receiving a message indicating that a RS code is applied to one or more scheduled signals based on the indication. The processing component 535 may be configured as or otherwise support a means for applying near maximal likelihood demodulation and RS decoding to a received signal of the one or more scheduled signals based on the message.

Figure 6:
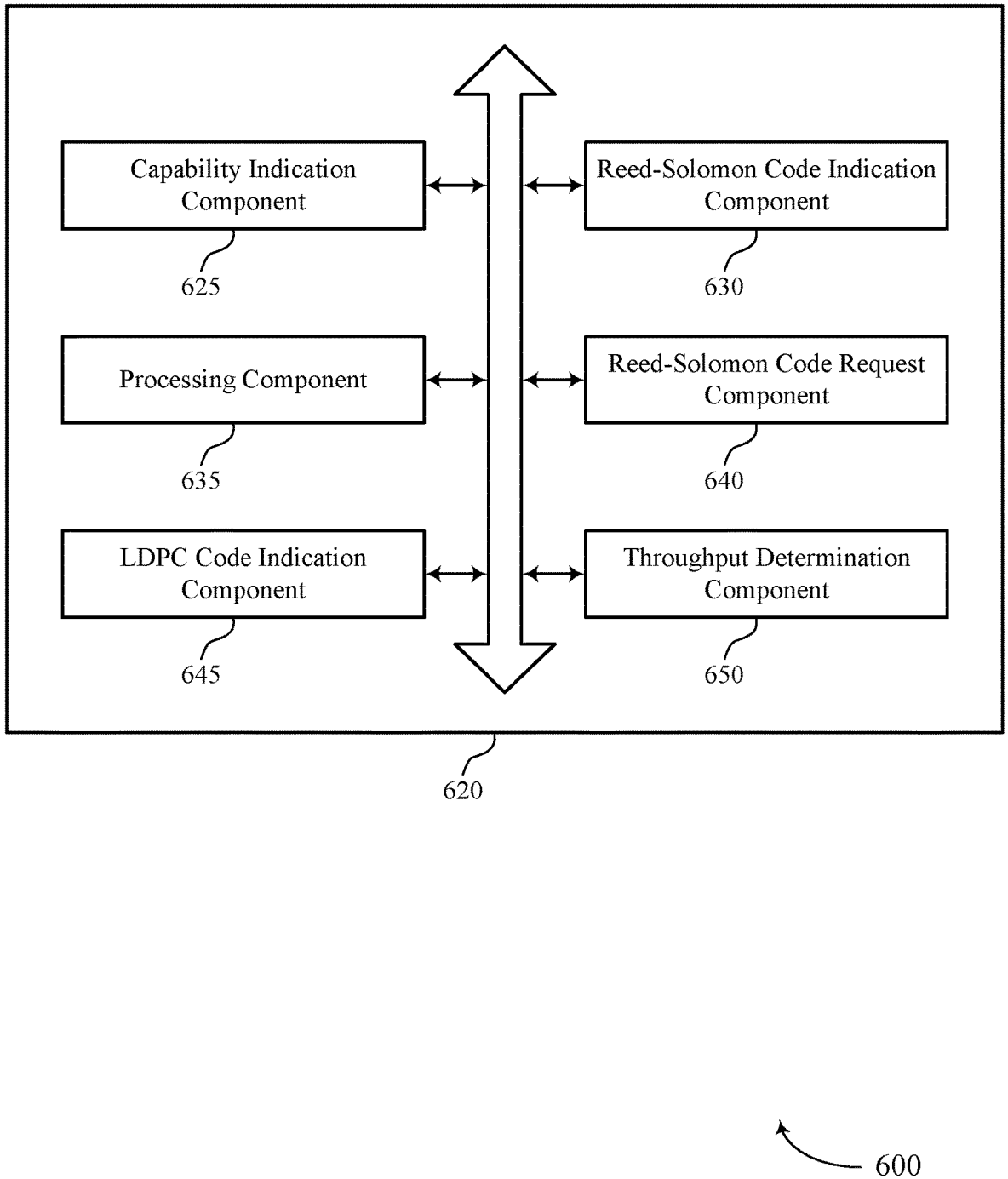
FIG. 6 shows a block diagram of a communications manager that supports techniques for implementing RS coding in accordance with one or more aspects of the present disclosure.

FIG. 6 shows a block diagram 600 of a communications manager 620 that supports techniques for implementing RS coding in accordance with one or more aspects of the present disclosure. The communications manager 620 may be an example of aspects of a communications manager 420, a communications manager 520, or both, as described herein. The communications manager 620, or various components thereof, may be an example of means for performing various aspects of techniques for implementing RS coding as described herein. For example, the communications manager 620 may include a capability indication component 625, a RS code indication component 630, a processing component 635, a RS code request component 640, an LDPC code indication component 645, a throughput determination component 650, or any combination thereof. Each of these components may communicate, directly or indirectly, with one another (e.g., via one or more buses).

The communications manager 620 may support wireless communications at a UE in accordance with examples as disclosed herein. The capability indication component 625 may be configured as or otherwise support a means for transmitting an indication that the UE is capable of decoding RS codes and that the UE is capable of performing near maximal likelihood demodulation. The RS code indication component 630 may be configured as or otherwise support a means for receiving a message indicating that a RS code is applied to one or more scheduled signals based on the indication. The processing component 635 may be configured as or otherwise support a means for applying near maximal likelihood demodulation and RS decoding to a received signal of the one or more scheduled signals based on the message.

In some examples, the RS code request component 640 may be configured as or otherwise support a means for transmitting a request for the RS code to be applied to the one or more scheduled signals, where receiving the message is based on the request.

In some examples, the UE transmits the request with the indication that the UE is capable of decoding RS codes and that the UE is capable of performing near maximal likelihood demodulation.

In some examples, the RS code request component 640 may be configured as or otherwise support a means for transmitting a channel state information report including uplink control information, where the UE includes the request with the uplink control information.

In some examples, the throughput determination component 650 may be configured as or otherwise support a means for determining that the UE is operating at high throughput, with high power consumption, or both, where transmitting the request is based on the determination.

In some examples, the high throughput is associated with a high SNR, a large constellation, a high code rate, a large number of layers, a rank, or a combination thereof.

In some examples, to support receiving the message, the RS code indication component 630 may be configured as or otherwise support a means for receiving DCI indicating that the RS code is applied to the one or more scheduled signals.

In some examples, to support receiving the message, the RS code indication component 630 may be configured as or otherwise support a means for receiving a RRC message indicating that the RS code is applied to the one or more scheduled signals.

In some examples, to support receiving the message, the RS code indication component 630 may be configured as or otherwise support a means for receiving a MAC-CE message indicating that the RS code is applied to the one or more scheduled signals.

In some examples, to support transmitting the indication, the capability indication component 625 may be configured as or otherwise support a means for transmitting a RRC, a MAC-CE message, or an uplink control information message including the indication that the UE is capable of decoding RS codes and that the UE is capable of performing near maximal likelihood demodulation.

In some examples, the LDPC code indication component 645 may be configured as or otherwise support a means for receiving a second message indicating that a Low-Density-Parity Check (LDPC) code is applied to one or more other scheduled signals. In some examples, the processing component 635 may be configured as or otherwise support a means for applying near the maximal likelihood demodulation and LDPC decoding to the one or more other scheduled signals based on the second message.

In some examples, the RS code request component 640 may be configured as or otherwise support a means for transmitting a request for the RS code to be applied to the one or more other scheduled signals, where the UE receives the second message irrespective of the request.

In some examples, the processing component 635 may be configured as or otherwise support a means for receiving a downlink shared channel, the downlink shared channel including the received signal.

Figure 7:
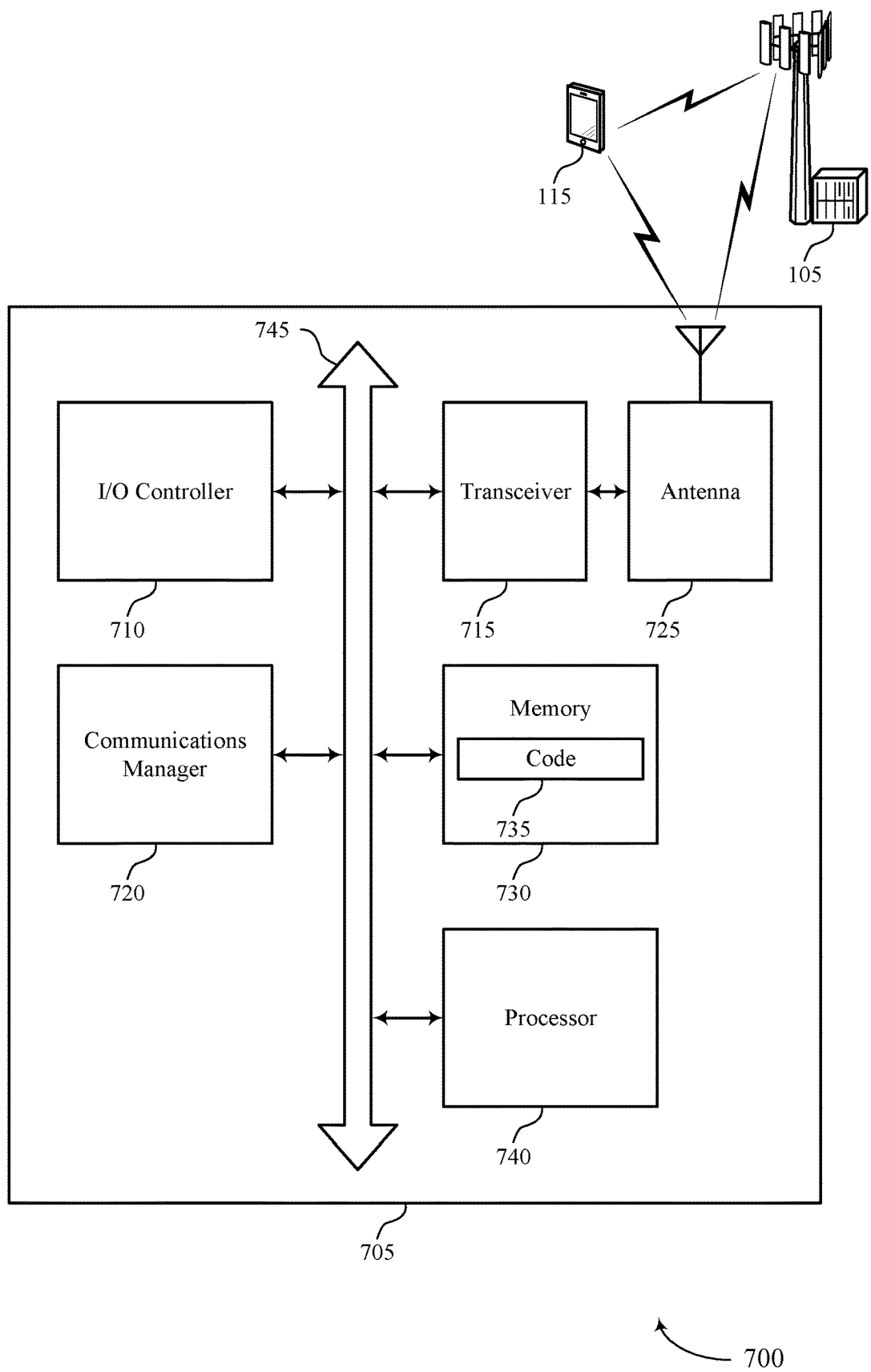
FIG. 7 shows a diagram of a system including a device that supports techniques for implementing RS coding in accordance with one or more aspects of the present disclosure.

FIG. 7 shows a diagram of a system 700 including a device 705 that supports techniques for implementing RS coding in accordance with one or more aspects of the present disclosure. The device 705 may be an example of or include the components of a device 405, a device 505, or a UE 115 as described herein. The device 705 may communicate (e.g., wirelessly) with one or more network entities 105, one or more UEs 115, or any combination thereof. The device 705 may include components for bi-directional voice and data communications including components for transmitting and receiving communications, such as a communications manager 720, an input/output (I/O) controller 710, a transceiver 715, an antenna 725, a memory 730, code 735, and a processor 740. These components may be in electronic communication or otherwise coupled (e.g., operatively, communicatively, functionally, electronically, electrically) via one or more buses (e.g., a bus 745).

The I/O controller 710 may manage input and output signals for the device 705. The I/O controller 710 may also manage peripherals not integrated into the device 705. In some cases, the I/O controller 710 may represent a physical connection or port to an external peripheral. In some cases, the I/O controller 710 may utilize an operating system such as iOS®, ANDROID®, MS-DOS®, MS-WINDOWS®, OS/2®, UNIX®, LINUX®, or another known operating system. Additionally, or alternatively, the I/O controller 710 may represent or interact with a modem, a keyboard, a mouse, a touchscreen, or a similar device. In some cases, the I/O controller 710 may be implemented as part of a processor, such as the processor 740. In some cases, a user may interact with the device 705 via the I/O controller 710 or via hardware components controlled by the I/O controller 710.

In some cases, the device 705 may include a single antenna 725. However, in some other cases, the device 705 may have more than one antenna 725, which may be capable of concurrently transmitting or receiving multiple wireless transmissions. The transceiver 715 may communicate bi-directionally, via the one or more antennas 725, wired, or wireless links as described herein. For example, the transceiver 715 may represent a wireless transceiver and may communicate bi-directionally with another wireless transceiver. The transceiver 715 may also include a modem to modulate the packets, to provide the modulated packets to one or more antennas 725 for transmission, and to demodulate packets received from the one or more antennas 725. The transceiver 715, or the transceiver 715 and one or more antennas 725, may be an example of a transmitter 415, a transmitter 515, a receiver 410, a receiver 510, or any combination thereof or component thereof, as described herein.

The memory 730 may include random access memory (RAM) and read-only memory (ROM). The memory 730 may store computer-readable, computer-executable code 735 including instructions that, when executed by the processor 740, cause the device 705 to perform various functions described herein. The code 735 may be stored in a non-transitory computer-readable medium such as system memory or another type of memory. In some cases, the code 735 may not be directly executable by the processor 740 but may cause a computer (e.g., when compiled and executed) to perform functions described herein. In some cases, the memory 730 may contain, among other things, a basic I/O system (BIOS) which may control basic hardware or software operation such as the interaction with peripheral components or devices.

The processor 740 may include an intelligent hardware device (e.g., a general-purpose processor, a DSP, a CPU, a microcontroller, an ASIC, an FPGA, a programmable logic device, a discrete gate or transistor logic component, a discrete hardware component, or any combination thereof). In some cases, the processor 740 may be configured to operate a memory array using a memory controller. In some other cases, a memory controller may be integrated into the processor 740. The processor 740 may be configured to execute computer-readable instructions stored in a memory (e.g., the memory 730) to cause the device 705 to perform various functions (e.g., functions or tasks supporting techniques for implementing RS coding). For example, the device 705 or a component of the device 705 may include a processor 740 and memory 730 coupled with or to the processor 740, the processor 740 and memory 730 configured to perform various functions described herein.

The communications manager 720 may support wireless communications at a UE in accordance with examples as disclosed herein. For example, the communications manager 720 may be configured as or otherwise support a means for transmitting an indication that the UE is capable of decoding RS codes and that the UE is capable of performing near maximal likelihood demodulation. The communications manager 720 may be configured as or otherwise support a means for receiving a message indicating that a RS code is applied to one or more scheduled signals based on the indication. The communications manager 720 may be configured as or otherwise support a means for applying near maximal likelihood demodulation and RS decoding to a received signal of the one or more scheduled signals based on the message.

By including or configuring the communications manager 720 in accordance with examples as described herein, the device 705 may support techniques for reduced latency, reduced power consumption, and more efficient utilization of communication resources.

In some examples, the communications manager 720 may be configured to perform various operations (e.g., receiving, monitoring, transmitting) using or otherwise in cooperation with the transceiver 715, the one or more antennas 725, or any combination thereof. Although the communications manager 720 is illustrated as a separate component, in some examples, one or more functions described with reference to the communications manager 720 may be supported by or performed by the processor 740, the memory 730, the code 735, or any combination thereof. For example, the code 735 may include instructions executable by the processor 740 to cause the device 705 to perform various aspects of techniques for implementing RS coding as described herein, or the processor 740 and the memory 730 may be otherwise configured to perform or support such operations.

Figure 8:
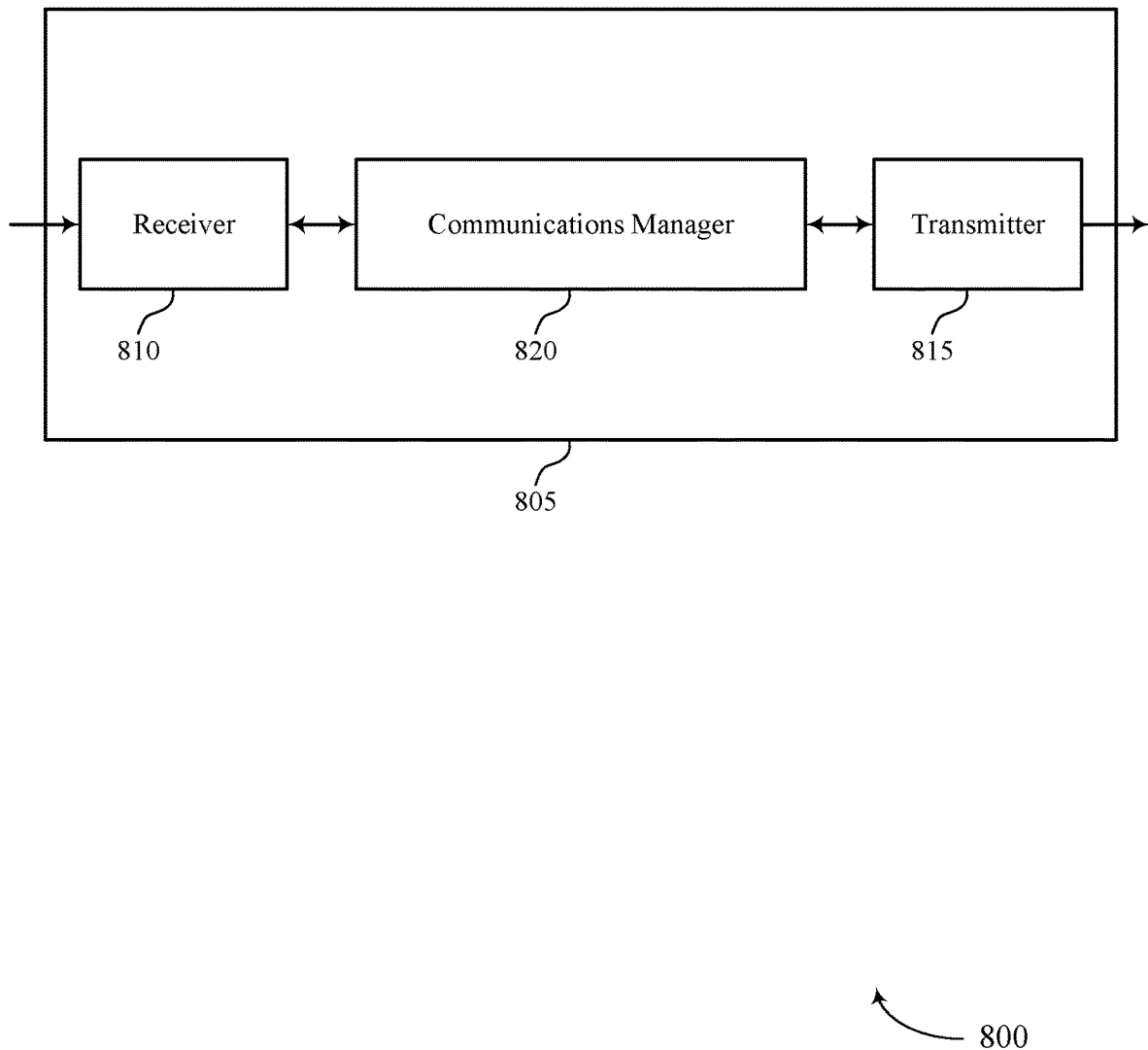
FIGS. 8 and 9 show block diagrams of devices that support techniques for implementing RS coding in accordance with one or more aspects of the present disclosure.

FIG. 8 shows a block diagram 800 of a device 805 that supports techniques for implementing RS coding in accordance with one or more aspects of the present disclosure. The device 805 may be an example of aspects of a network entity 105 as described herein. The device 805 may include a receiver 810, a transmitter 815, and a communications manager 820. The device 805 may also include a processor. Each of these components may be in communication with one another (e.g., via one or more buses).

The receiver 810 may provide a means for obtaining (e.g., receiving, determining, identifying) information such as user data, control information, or any combination thereof (e.g., I/Q samples, symbols, packets, protocol data units, service data units) associated with various channels (e.g., control channels, data channels, information channels, channels associated with a protocol stack). Information may be passed on to other components of the device 805. In some examples, the receiver 810 may support obtaining information by receiving signals via one or more antennas. Additionally, or alternatively, the receiver 810 may support obtaining information by receiving signals via one or more wired (e.g., electrical, fiber optic) interfaces, wireless interfaces, or any combination thereof.

The transmitter 815 may provide a means for outputting (e.g., transmitting, providing, conveying, sending) information generated by other components of the device 805. For example, the transmitter 815 may output information such as user data, control information, or any combination thereof (e.g., I/Q samples, symbols, packets, protocol data units, service data units) associated with various channels (e.g., control channels, data channels, information channels, channels associated with a protocol stack). In some examples, the transmitter 815 may support outputting information by transmitting signals via one or more antennas. Additionally, or alternatively, the transmitter 815 may support outputting information by transmitting signals via one or more wired (e.g., electrical, fiber optic) interfaces, wireless interfaces, or any combination thereof. In some examples, the transmitter 815 and the receiver 810 may be co-located in a transceiver, which may include or be coupled with a modem.

The communications manager 820, the receiver 810, the transmitter 815, or various combinations thereof or various components thereof may be examples of means for performing various aspects of techniques for implementing RS coding as described herein. For example, the communications manager 820, the receiver 810, the transmitter 815, or various combinations or components thereof may support a method for performing one or more of the functions described herein.

In some examples, the communications manager 820, the receiver 810, the transmitter 815, or various combinations or components thereof may be implemented in hardware (e.g., in communications management circuitry). The hardware may include a processor, a DSP, a CPU, an ASIC, an FPGA or other programmable logic device, a microcontroller, discrete gate or transistor logic, discrete hardware components, or any combination thereof configured as or otherwise supporting a means for performing the functions described in the present disclosure. In some examples, a processor and memory coupled with the processor may be configured to perform one or more of the functions described herein (e.g., by executing, by the processor, instructions stored in the memory).

Additionally, or alternatively, in some examples, the communications manager 820, the receiver 810, the transmitter 815, or various combinations or components thereof may be implemented in code (e.g., as communications management software or firmware) executed by a processor. If implemented in code executed by a processor, the functions of the communications manager 820, the receiver 810, the transmitter 815, or various combinations or components thereof may be performed by a general-purpose processor, a DSP, a CPU, an ASIC, an FPGA, a microcontroller, or any combination of these or other programmable logic devices (e.g., configured as or otherwise supporting a means for performing the functions described in the present disclosure).

In some examples, the communications manager 820 may be configured to perform various operations (e.g., receiving, obtaining, monitoring, outputting, transmitting) using or otherwise in cooperation with the receiver 810, the transmitter 815, or both. For example, the communications manager 820 may receive information from the receiver 810, send information to the transmitter 815, or be integrated in combination with the receiver 810, the transmitter 815, or both to obtain information, output information, or perform various other operations as described herein.

The communications manager 820 may support wireless communications at a network entity in accordance with examples as disclosed herein. For example, the communications manager 820 may be configured as or otherwise support a means for receiving an indication that a UE is capable of decoding RS codes and that the UE is capable of performing near maximal likelihood demodulation. The communications manager 820 may be configured as or otherwise support a means for transmitting a message indicating that a RS code is applied to one or more scheduled signals based on the indication. The communications manager 820 may be configured as or otherwise support a means for applying RS coding to a signal of the one or more scheduled signals based on the message.

By including or configuring the communications manager 820 in accordance with examples as described herein, the device 805 (e.g., a processor controlling or otherwise coupled with the receiver 810, the transmitter 815, the communications manager 820, or a combination thereof) may support techniques for reduced power consumption and more efficient utilization of communication resources.

Figure 9:
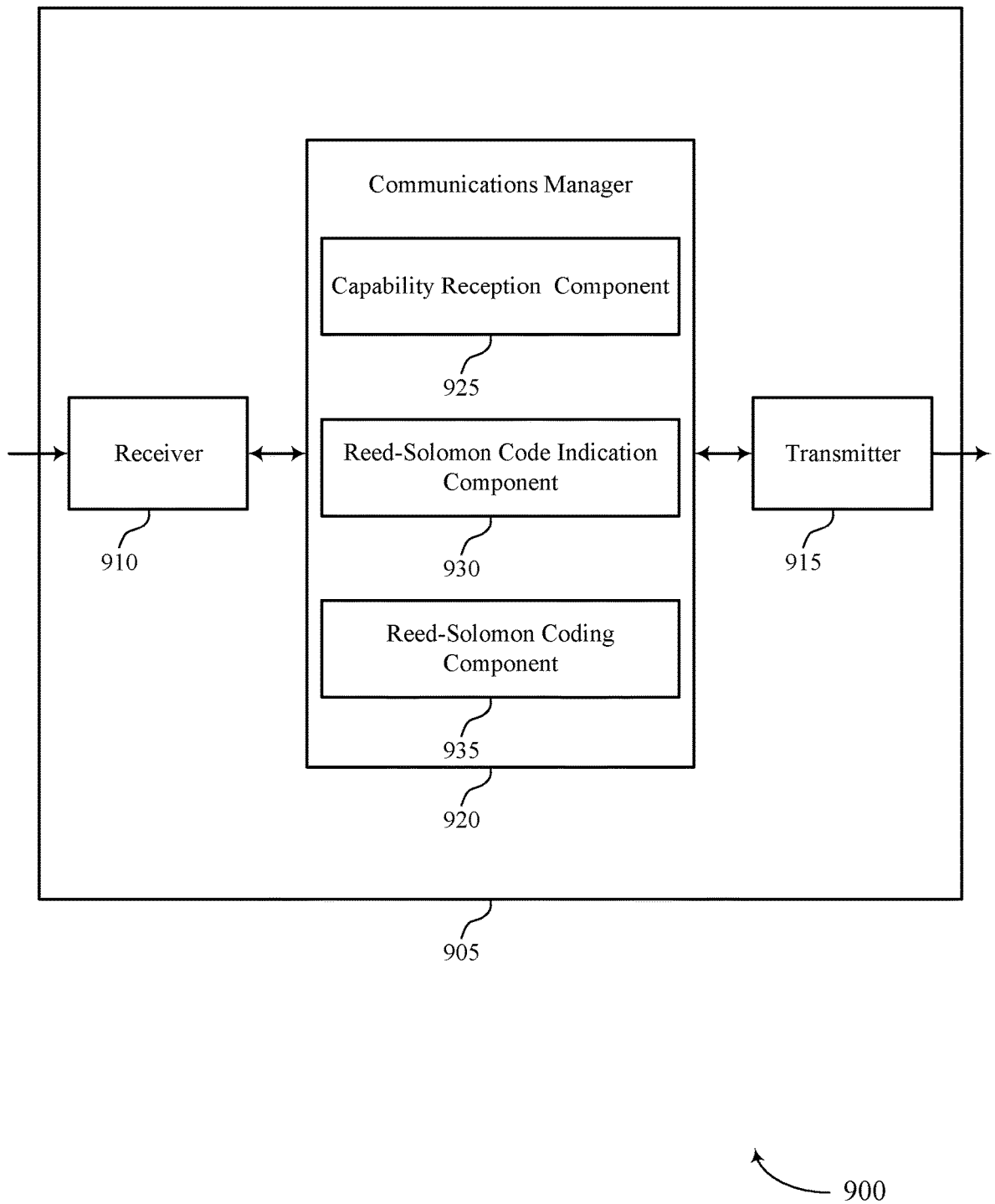

FIG. 9 shows a block diagram 900 of a device 905 that supports techniques for implementing RS coding in accordance with one or more aspects of the present disclosure. The device 905 may be an example of aspects of a device 805 or a network entity 105 as described herein. The device 905 may include a receiver 910, a transmitter 915, and a communications manager 920. The device 905 may also include a processor. Each of these components may be in communication with one another (e.g., via one or more buses).

The receiver 910 may provide a means for obtaining (e.g., receiving, determining, identifying) information such as user data, control information, or any combination thereof (e.g., I/Q samples, symbols, packets, protocol data units, service data units) associated with various channels (e.g., control channels, data channels, information channels, channels associated with a protocol stack). Information may be passed on to other components of the device 905. In some examples, the receiver 910 may support obtaining information by receiving signals via one or more antennas. Additionally, or alternatively, the receiver 910 may support obtaining information by receiving signals via one or more wired (e.g., electrical, fiber optic) interfaces, wireless interfaces, or any combination thereof.

The transmitter 915 may provide a means for outputting (e.g., transmitting, providing, conveying, sending) information generated by other components of the device 905. For example, the transmitter 915 may output information such as user data, control information, or any combination thereof (e.g., I/Q samples, symbols, packets, protocol data units, service data units) associated with various channels (e.g., control channels, data channels, information channels, channels associated with a protocol stack). In some examples, the transmitter 915 may support outputting information by transmitting signals via one or more antennas. Additionally, or alternatively, the transmitter 915 may support outputting information by transmitting signals via one or more wired (e.g., electrical, fiber optic) interfaces, wireless interfaces, or any combination thereof. In some examples, the transmitter 915 and the receiver 910 may be co-located in a transceiver, which may include or be coupled with a modem.

The device 905, or various components thereof, may be an example of means for performing various aspects of techniques for implementing RS coding as described herein. For example, the communications manager 920 may include a capability reception component 925, a RS code indication component 930, a RS coding component 935, or any combination thereof. The communications manager 920 may be an example of aspects of a communications manager 820 as described herein. In some examples, the communications manager 920, or various components thereof, may be configured to perform various operations (e.g., receiving, obtaining, monitoring, outputting, transmitting) using or otherwise in cooperation with the receiver 910, the transmitter 915, or both. For example, the communications manager 920 may receive information from the receiver 910, send information to the transmitter 915, or be integrated in combination with the receiver 910, the transmitter 915, or both to obtain information, output information, or perform various other operations as described herein.

The communications manager 920 may support wireless communications at a network entity in accordance with examples as disclosed herein. The capability reception component 925 may be configured as or otherwise support a means for receiving an indication that a UE is capable of decoding RS codes and that the UE is capable of performing near maximal likelihood demodulation. The RS code indication component 930 may be configured as or otherwise support a means for transmitting a message indicating that a RS code is applied to one or more scheduled signals based on the indication. The RS coding component 935 may be configured as or otherwise support a means for applying RS coding to a signal of the one or more scheduled signals based on the message.

Figure 10:
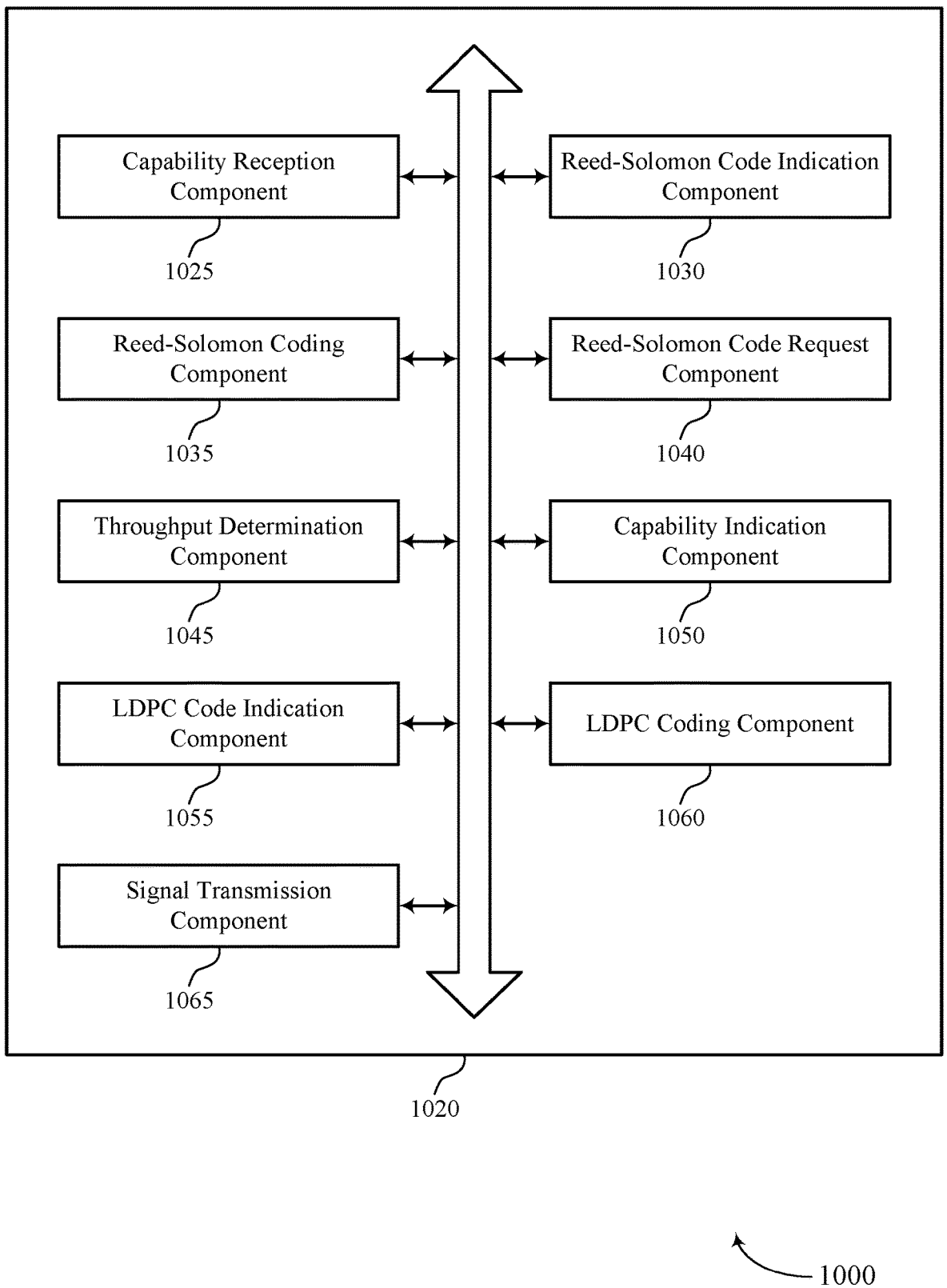
FIG. 10 shows a block diagram of a communications manager that supports techniques for implementing RS coding in accordance with one or more aspects of the present disclosure.

FIG. 10 shows a block diagram 1000 of a communications manager 1020 that supports techniques for implementing RS coding in accordance with one or more aspects of the present disclosure. The communications manager 1020 may be an example of aspects of a communications manager 820, a communications manager 920, or both, as described herein. The communications manager 1020, or various components thereof, may be an example of means for performing various aspects of techniques for implementing RS coding as described herein. For example, the communications manager 1020 may include a capability reception component 1025, a RS code indication component 1030, a RS coding component 1035, a RS code request component 1040, a throughput determination component 1045, a capability indication component 1050, an LDPC code indication component 1055, an LDPC coding component 1060, a signal transmission component 1065, or any combination thereof. Each of these components may communicate, directly or indirectly, with one another (e.g., via one or more buses) which may include communications within a protocol layer of a protocol stack, communications associated with a logical channel of a protocol stack (e.g., between protocol layers of a protocol stack, within a device, component, or virtualized component associated with a network entity 105, between devices, components, or virtualized components associated with a network entity 105), or any combination thereof.

The communications manager 1020 may support wireless communications at a network entity in accordance with examples as disclosed herein. The capability reception component 1025 may be configured as or otherwise support a means for receiving an indication that a UE is capable of decoding RS codes and that the UE is capable of performing near maximal likelihood demodulation. The RS code indication component 1030 may be configured as or otherwise support a means for transmitting a message indicating that a RS code is applied to one or more scheduled signals based on the indication. The RS coding component 1035 may be configured as or otherwise support a means for applying RS coding to a signal of the one or more scheduled signals based on the message.

In some examples, the RS code request component 1040 may be configured as or otherwise support a means for receiving a request for the network entity to apply the RS code to the one or more scheduled signals, where transmitting the message and applying the RS coding to the signal is based on the request.

In some examples, the request is included with the indication that the UE is capable of decoding RS codes and that the UE is capable of performing near the maximal likelihood demodulation.

In some examples, the RS code request component 1040 may be configured as or otherwise support a means for receiving a channel state information report including uplink control information, where the request is included with the uplink control information.

In some examples, the throughput determination component 1045 may be configured as or otherwise support a means for determining that the UE is operating at high throughput, with high power consumption, or both, where transmitting the message and applying the RS coding to the signal is based on the determination.

In some examples, the high throughput is associated with a high SNR, a large constellation, a high code rate, a large number of layers, a rank, or a combination thereof.

In some examples, to support transmitting the message, the RS code indication component 1030 may be configured as or otherwise support a means for transmitting DCI indicating that the RS code is applied to the one or more scheduled signals.

In some examples, to support transmitting the message, the RS code indication component 1030 may be configured as or otherwise support a means for transmitting a RRC message indicating that the RS code is applied to the one or more scheduled signals.

In some examples, to support transmitting the message, the RS code indication component 1030 may be configured as or otherwise support a means for transmitting a MAC-CE message indicating that the RS code is applied to the one or more scheduled signals.

In some examples, to support receiving the indication, the capability indication component 1050 may be configured as or otherwise support a means for receiving a RRC message, a MAC-CE message, or an uplink control information message including the indication that the UE is capable of decoding RS codes and that the UE is capable of performing near maximal likelihood demodulation.

In some examples, the LDPC code indication component 1055 may be configured as or otherwise support a means for transmitting a second message indicating that a Low-Density-Parity Check (LDPC) code is applied to one or more other scheduled signals. In some examples, the LDPC coding component 1060 may be configured as or otherwise support a means for applying LDPC coding to the one or more other scheduled signals in accordance with the second message. In some examples, the RS code request component 1040 may be configured as or otherwise support a means for receiving a request for the network entity to apply the RS code to the one or more other scheduled signals. In some examples, the LDPC coding component 1060 may be configured as or otherwise support a means for determining to apply LDPC coding to the one or more other scheduled signals irrespective of the request, where transmitting the second message and applying LDPC coding is based on the determination.

In some examples, the signal transmission component 1065 may be configured as or otherwise support a means for transmitting a downlink shared channel, the downlink shared channel including the signal.

Figure 11:
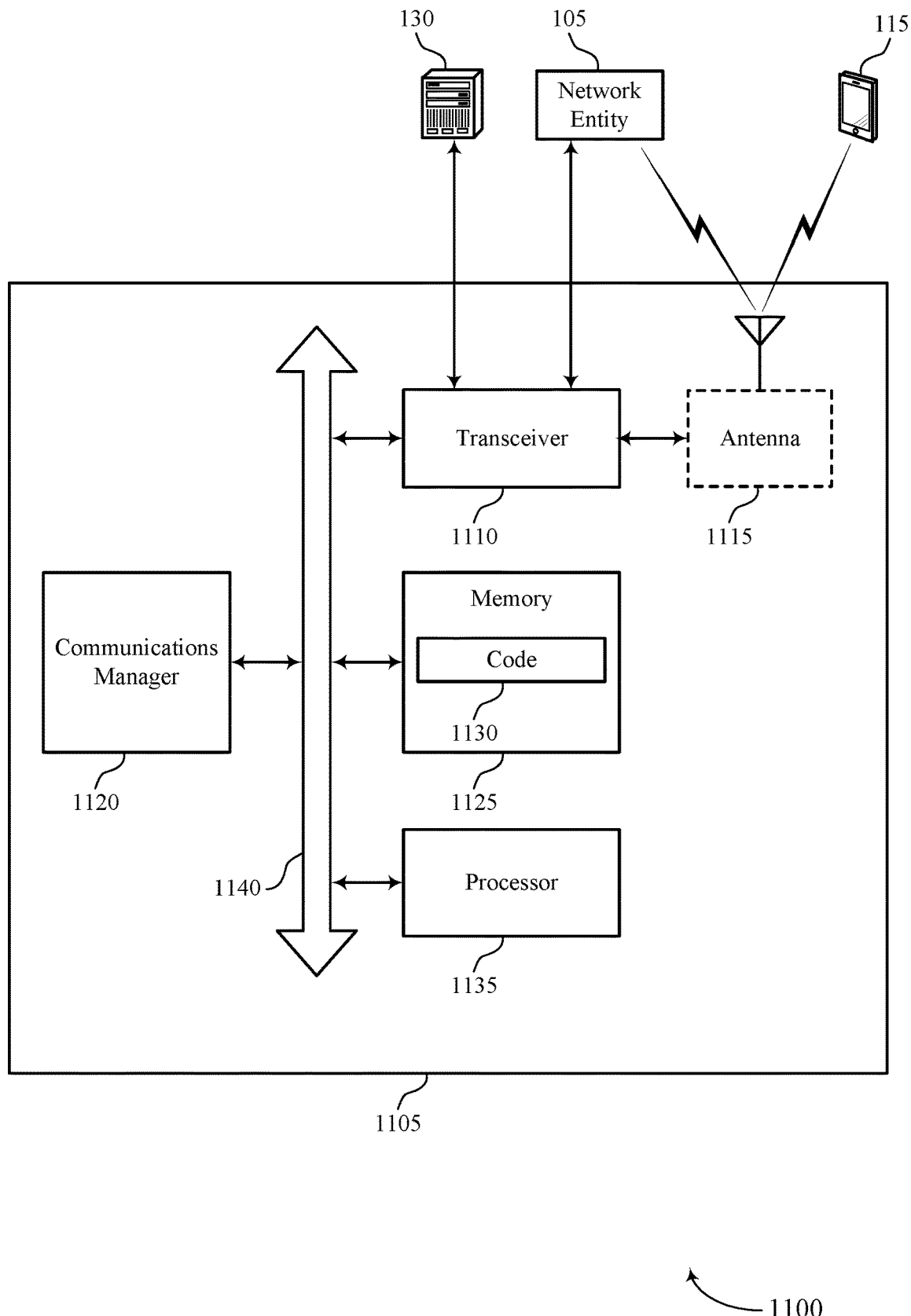
FIG. 11 shows a diagram of a system including a device that supports techniques for implementing RS coding in accordance with one or more aspects of the present disclosure.

FIG. 11 shows a diagram of a system 1100 including a device 1105 that supports techniques for implementing RS coding in accordance with one or more aspects of the present disclosure. The device 1105 may be an example of or include the components of a device 805, a device 905, or a network entity 105 as described herein. The device 1105 may communicate with one or more network entities 105, one or more UEs 115, or any combination thereof, which may include communications over one or more wired interfaces, over one or more wireless interfaces, or any combination thereof. The device 1105 may include components that support outputting and obtaining communications, such as a communications manager 1120, a transceiver 1110, an antenna 1115, a memory 1125, code 1130, and a processor 1135. These components may be in electronic communication or otherwise coupled (e.g., operatively, communicatively, functionally, electronically, electrically) via one or more buses (e.g., a bus 1140).

The transceiver 1110 may support bi-directional communications via wired links, wireless links, or both as described herein. In some examples, the transceiver 1110 may include a wired transceiver and may communicate bi-directionally with another wired transceiver. Additionally, or alternatively, in some examples, the transceiver 1110 may include a wireless transceiver and may communicate bi-directionally with another wireless transceiver. In some examples, the device 1105 may include one or more antennas 1115, which may be capable of transmitting or receiving wireless transmissions (e.g., concurrently). The transceiver 1110 may also include a modem to modulate signals, to provide the modulated signals for transmission (e.g., by one or more antennas 1115, by a wired transmitter), to receive modulated signals (e.g., from one or more antennas 1115, from a wired receiver), and to demodulate signals. The transceiver 1110, or the transceiver 1110 and one or more antennas 1115 or wired interfaces, where applicable, may be an example of a transmitter 815, a transmitter 915, a receiver 810, a receiver 910, or any combination thereof or component thereof, as described herein. In some examples, the transceiver may be operable to support communications via one or more communications links (e.g., a communication link 125, a backhaul communication link 120, a midhaul communication link 162, a fronthaul communication link 168).

The memory 1125 may include RAM and ROM. The memory 1125 may store computer-readable, computer-executable code 1130 including instructions that, when executed by the processor 1135, cause the device 1105 to perform various functions described herein. The code 1130 may be stored in a non-transitory computer-readable medium such as system memory or another type of memory. In some cases, the code 1130 may not be directly executable by the processor 1135 but may cause a computer (e.g., when compiled and executed) to perform functions described herein. In some cases, the memory 1125 may contain, among other things, a BIOS which may control basic hardware or software operation such as the interaction with peripheral components or devices.

The processor 1135 may include an intelligent hardware device (e.g., a general-purpose processor, a DSP, an ASIC, a CPU, an FPGA, a microcontroller, a programmable logic device, discrete gate or transistor logic, a discrete hardware component, or any combination thereof). In some cases, the processor 1135 may be configured to operate a memory array using a memory controller. In some other cases, a memory controller may be integrated into the processor 1135. The processor 1135 may be configured to execute computer-readable instructions stored in a memory (e.g., the memory 1125) to cause the device 1105 to perform various functions (e.g., functions or tasks supporting techniques for implementing RS coding). For example, the device 1105 or a component of the device 1105 may include a processor 1135 and memory 1125 coupled with the processor 1135, the processor 1135 and memory 1125 configured to perform various functions described herein. The processor 1135 may be an example of a cloud-computing platform (e.g., one or more physical nodes and supporting software such as operating systems, virtual machines, or container instances) that may host the functions (e.g., by executing code 1130) to perform the functions of the device 1105.

In some examples, a bus 1140 may support communications of (e.g., within) a protocol layer of a protocol stack. In some examples, a bus 1140 may support communications associated with a logical channel of a protocol stack (e.g., between protocol layers of a protocol stack), which may include communications performed within a component of the device 1105, or between different components of the device 1105 that may be co-located or located in different locations (e.g., where the device 1105 may refer to a system in which one or more of the communications manager 1120, the transceiver 1110, the memory 1125, the code 1130, and the processor 1135 may be located in one of the different components or divided between different components).

In some examples, the communications manager 1120 may manage aspects of communications with a core network 130 (e.g., via one or more wired or wireless backhaul links). For example, the communications manager 1120 may manage the transfer of data communications for client devices, such as one or more UEs 115. In some examples, the communications manager 1120 may manage communications with other network entities 105, and may include a controller or scheduler for controlling communications with UEs 115 in cooperation with other network entities 105. In some examples, the communications manager 1120 may support an X2 interface within an LTE/LTE-A wireless communications network technology to provide communication between network entities 105.

The communications manager 1120 may support wireless communications at a network entity in accordance with examples as disclosed herein. For example, the communications manager 1120 may be configured as or otherwise support a means for receiving an indication that a UE is capable of decoding RS codes and that the UE is capable of performing near maximal likelihood demodulation. The communications manager 1120 may be configured as or otherwise support a means for transmitting a message indicating that a RS code is applied to one or more scheduled signals based on the indication. The communications manager 1120 may be configured as or otherwise support a means for applying RS coding to a signal of the one or more scheduled signals based on the message.

By including or configuring the communications manager 1120 in accordance with examples as described herein, the device 1105 may support techniques for reduced latency, reduced power consumption, and more efficient utilization of communication resources.

In some examples, the communications manager 1120 may be configured to perform various operations (e.g., receiving, obtaining, monitoring, outputting, transmitting) using or otherwise in cooperation with the transceiver 1110, the one or more antennas 1115 (e.g., where applicable), or any combination thereof. Although the communications manager 1120 is illustrated as a separate component, in some examples, one or more functions described with reference to the communications manager 1120 may be supported by or performed by the processor 1135, the memory 1125, the code 1130, the transceiver 1110, or any combination thereof. For example, the code 1130 may include instructions executable by the processor 1135 to cause the device 1105 to perform various aspects of techniques for implementing RS coding as described herein, or the processor 1135 and the memory 1125 may be otherwise configured to perform or support such operations.

Figure 12:
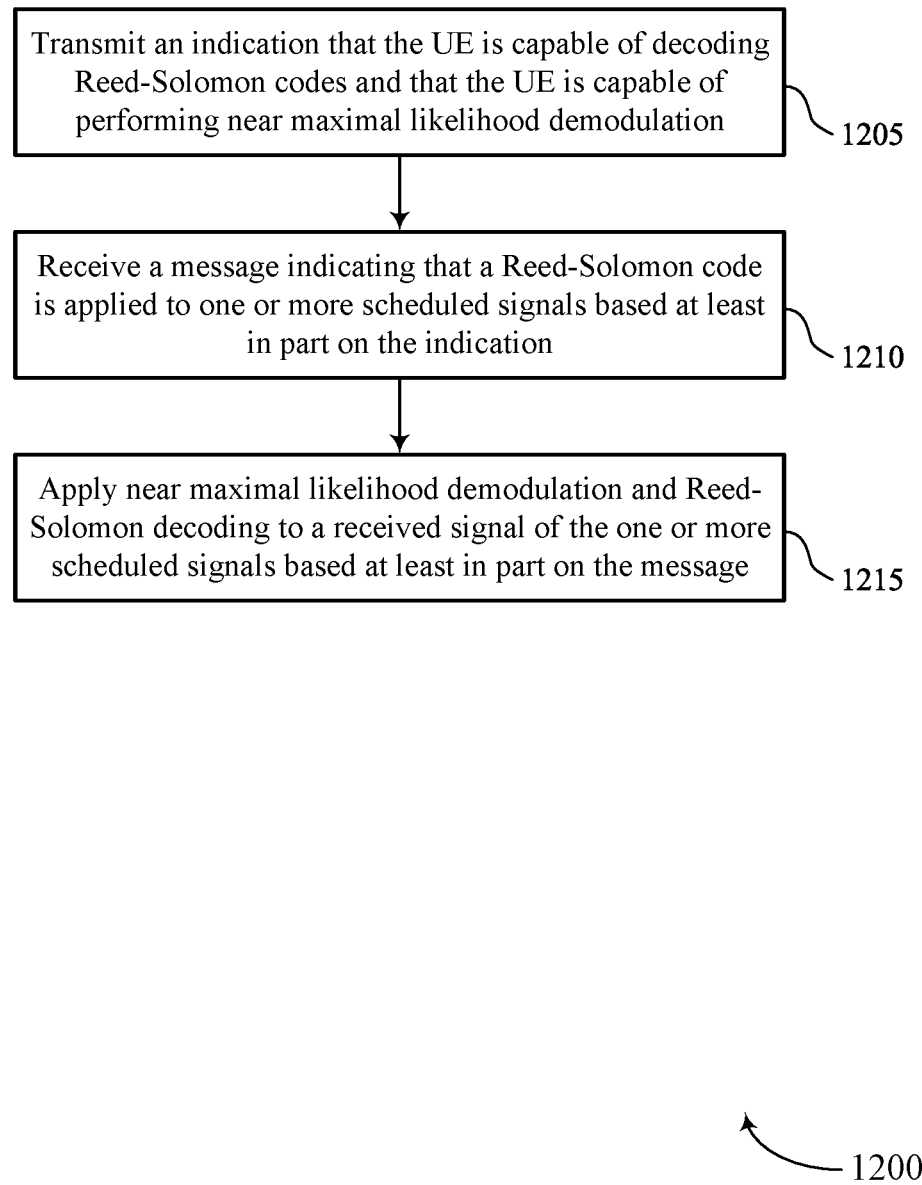
FIGS. 12 through 15 show flowcharts illustrating methods that support techniques for implementing RS coding in accordance with one or more aspects of the present disclosure.

FIG. 12 shows a flowchart illustrating a method 1200 that supports techniques for implementing RS coding in accordance with one or more aspects of the present disclosure. The operations of the method 1200 may be implemented by a UE or its components as described herein. For example, the operations of the method 1200 may be performed by a UE 115 as described with reference to FIGS. 1 through 7. In some examples, a UE may execute a set of instructions to control the functional elements of the UE to perform the described functions. Additionally, or alternatively, the UE may perform aspects of the described functions using special-purpose hardware.

At 1205, the method may include transmitting an indication that the UE is capable of decoding RS codes and that the UE is capable of performing near maximal likelihood demodulation. The operations of 1205 may be performed in accordance with examples as disclosed herein. In some examples, aspects of the operations of 1205 may be performed by a capability indication component 625 as described with reference to FIG. 6.

At 1210, the method may include receiving a message indicating that a RS code is applied to one or more scheduled signals based on the indication. The operations of 1210 may be performed in accordance with examples as disclosed herein. In some examples, aspects of the operations of 1210 may be performed by a RS code indication component 630 as described with reference to FIG. 6.

At 1215, the method may include applying near maximal likelihood demodulation and RS decoding to a received signal of the one or more scheduled signals based on the message. The operations of 1215 may be performed in accordance with examples as disclosed herein. In some examples, aspects of the operations of 1215 may be performed by a processing component 635 as described with reference to FIG. 6.

Figure 13:
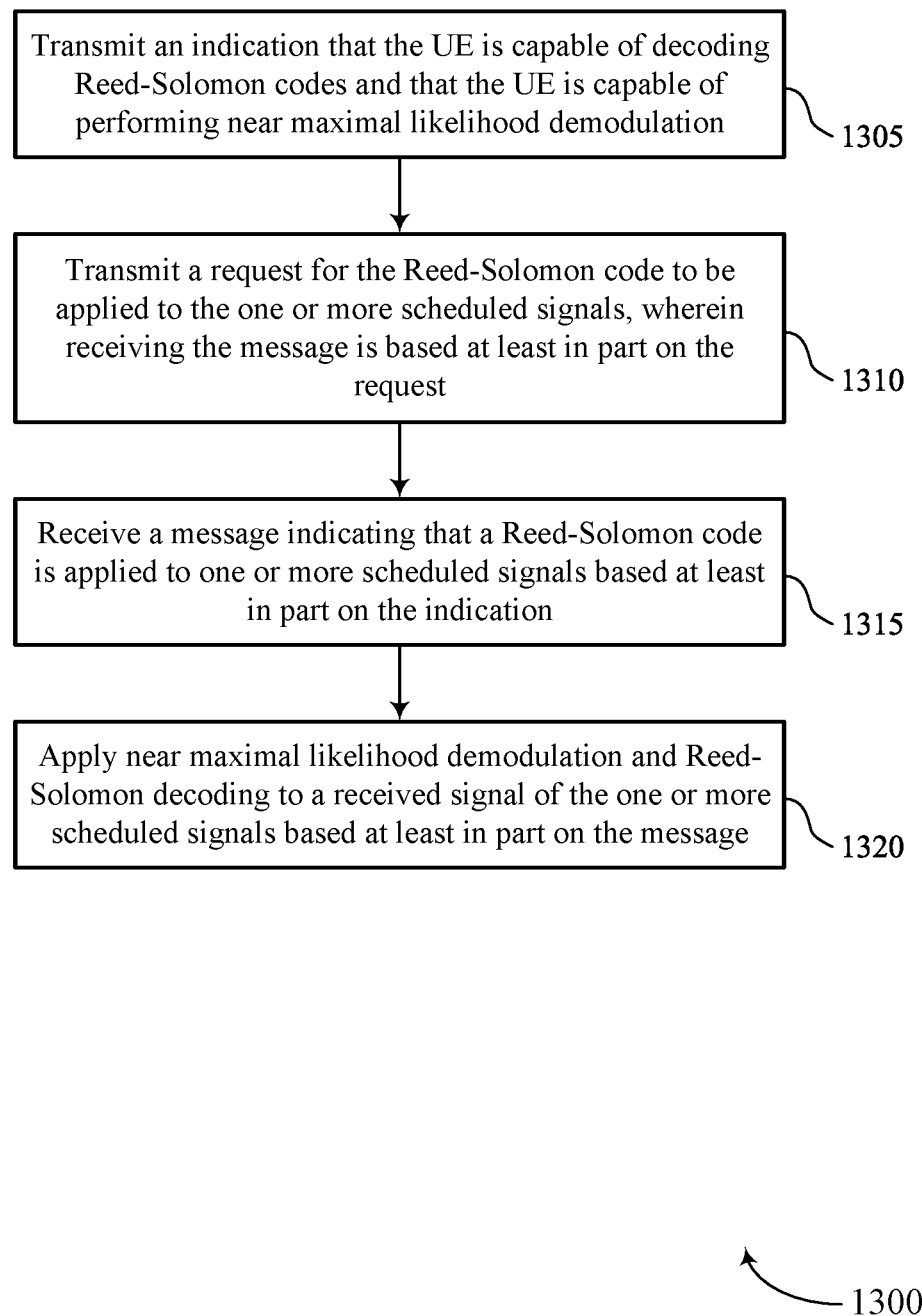

FIG. 13 shows a flowchart illustrating a method 1300 that supports techniques for implementing RS coding in accordance with one or more aspects of the present disclosure. The operations of the method 1300 may be implemented by a UE or its components as described herein. For example, the operations of the method 1300 may be performed by a UE 115 as described with reference to FIGS. 1 through 7. In some examples, a UE may execute a set of instructions to control the functional elements of the UE to perform the described functions. Additionally, or alternatively, the UE may perform aspects of the described functions using special-purpose hardware.

At 1305, the method may include transmitting an indication that the UE is capable of decoding RS codes and that the UE is capable of performing near maximal likelihood demodulation. The operations of 1305 may be performed in accordance with examples as disclosed herein. In some examples, aspects of the operations of 1305 may be performed by a capability indication component 625 as described with reference to FIG. 6.

At 1310, the method may include transmitting a request for the RS code to be applied to the one or more scheduled signals, where receiving the message is based on the request. The operations of 1310 may be performed in accordance with examples as disclosed herein. In some examples, aspects of the operations of 1310 may be performed by a RS code request component 640 as described with reference to FIG. 6.

At 1315, the method may include receiving a message indicating that a RS code is applied to one or more scheduled signals based on the indication. The operations of 1315 may be performed in accordance with examples as disclosed herein. In some examples, aspects of the operations of 1315 may be performed by a RS code indication component 630 as described with reference to FIG. 6.

At 1320, the method may include applying near maximal likelihood demodulation and RS decoding to a received signal of the one or more scheduled signals based on the message. The operations of 1320 may be performed in accordance with examples as disclosed herein. In some examples, aspects of the operations of 1320 may be performed by a processing component 635 as described with reference to FIG. 6.

Figure 14:
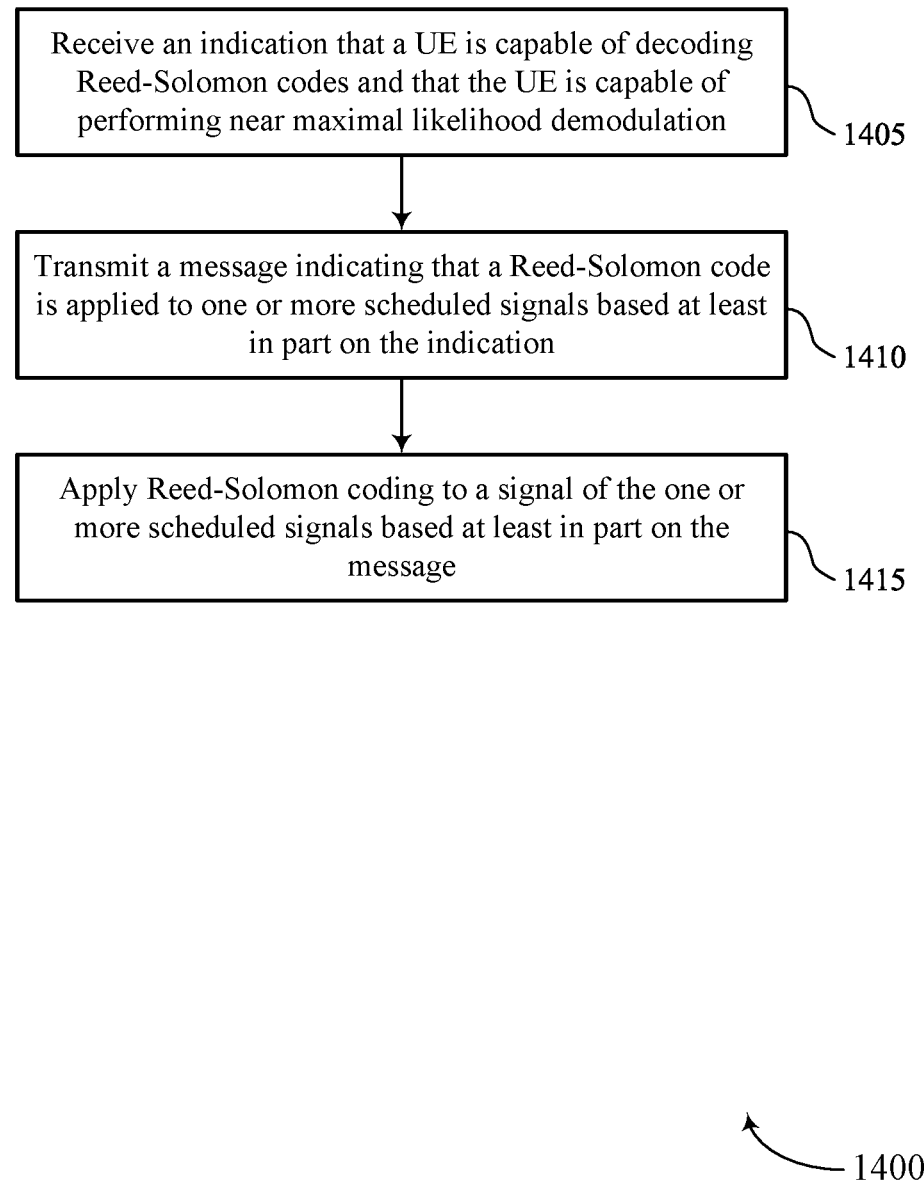

FIG. 14 shows a flowchart illustrating a method 1400 that supports techniques for implementing RS coding in accordance with one or more aspects of the present disclosure. The operations of the method 1400 may be implemented by a network entity or its components as described herein. For example, the operations of the method 1400 may be performed by a network entity as described with reference to FIGS. 1 through 3 and 8 through 11. In some examples, a network entity may execute a set of instructions to control the functional elements of the network entity to perform the described functions. Additionally, or alternatively, the network entity may perform aspects of the described functions using special-purpose hardware.

At 1405, the method may include receiving an indication that a UE is capable of decoding RS codes and that the UE is capable of performing near maximal likelihood demodulation. The operations of 1405 may be performed in accordance with examples as disclosed herein. In some examples, aspects of the operations of 1405 may be performed by a capability reception component 1025 as described with reference to FIG. 10.

At 1410, the method may include transmitting a message indicating that a RS code is applied to one or more scheduled signals based on the indication. The operations of 1410 may be performed in accordance with examples as disclosed herein. In some examples, aspects of the operations of 1410 may be performed by a RS code indication component 1030 as described with reference to FIG. 10.

At 1415, the method may include applying RS coding to a signal of the one or more scheduled signals based on the message. The operations of 1415 may be performed in accordance with examples as disclosed herein. In some examples, aspects of the operations of 1415 may be performed by a RS coding component 1035 as described with reference to FIG. 10.

Figure 15:
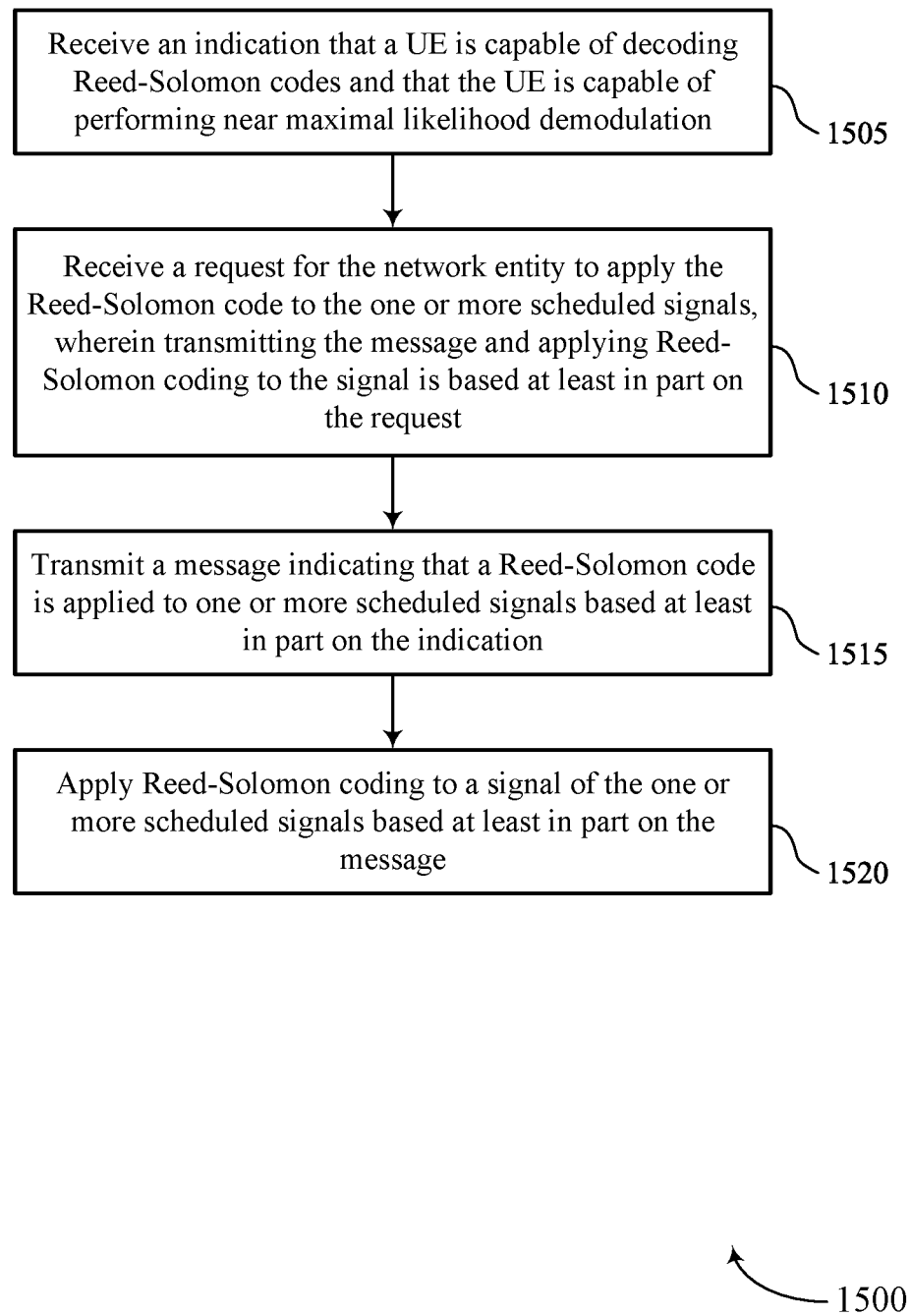

FIG. 15 shows a flowchart illustrating a method 1500 that supports techniques for implementing RS coding in accordance with one or more aspects of the present disclosure. The operations of the method 1500 may be implemented by a network entity or its components as described herein. For example, the operations of the method 1500 may be performed by a network entity as described with reference to FIGS. 1 through 3 and 8 through 11. In some examples, a network entity may execute a set of instructions to control the functional elements of the network entity to perform the described functions. Additionally, or alternatively, the network entity may perform aspects of the described functions using special-purpose hardware.

At 1505, the method may include receiving an indication that a UE is capable of decoding RS codes and that the UE is capable of performing near maximal likelihood demodulation. The operations of 1505 may be performed in accordance with examples as disclosed herein. In some examples, aspects of the operations of 1505 may be performed by a capability reception component 1025 as described with reference to FIG. 10.

At 1510, the method may include receiving a request for the network entity to apply the RS code to the one or more scheduled signals, where transmitting the message and applying RS coding to the signal is based on the request. The operations of 1510 may be performed in accordance with examples as disclosed herein. In some examples, aspects of the operations of 1510 may be performed by a RS code request component 1040 as described with reference to FIG. 10.

At 1515, the method may include transmitting a message indicating that a RS code is applied to one or more scheduled signals based on the indication. The operations of 1515 may be performed in accordance with examples as disclosed herein. In some examples, aspects of the operations of 1515 may be performed by a RS code indication component 1030 as described with reference to FIG. 10.

At 1520, the method may include applying RS coding to a signal of the one or more scheduled signals based on the message. The operations of 1520 may be performed in accordance with examples as disclosed herein. In some examples, aspects of the operations of 1520 may be performed by a RS coding component 1035 as described with reference to FIG. 10.

The following provides an overview of aspects of the present disclosure:

Aspect 1: A method for wireless communications at a UE, comprising: transmitting an indication that the UE is capable of decoding Reed-Solomon codes and that the UE is capable of performing near maximal likelihood demodulation; receiving a message indicating that a Reed-Solomon code is applied to one or more scheduled signals based at least in part on the indication; and applying near maximal likelihood demodulation and Reed-Solomon decoding to a received signal of the one or more scheduled signals based at least in part on the message.

Aspect 2: The method of aspect 1, further comprising: transmitting a request for the Reed-Solomon code to be applied to the one or more scheduled signals, wherein receiving the message is based at least in part on the request.

Aspect 3: The method of aspect 2, wherein the UE transmits the request with the indication that the UE is capable of decoding Reed-Solomon codes and that the UE is capable of performing near maximal likelihood demodulation.

Aspect 4: The method of any of aspects 2 through 3, further comprising: transmitting a channel state information report comprising uplink control information, wherein the UE includes the request with the uplink control information.

Aspect 5: The method of any of aspects 2 through 4, further comprising: determining that the UE is operating at high throughput, with high power consumption, or both, wherein transmitting the request is based at least in part on the determination.

Aspect 6: The method of aspect 5, wherein the high throughput is associated with a high SNR, a large constellation, a high code rate, a large number of layers, a rank, or a combination thereof.

Aspect 7: The method of any of aspects 1 through 6, wherein receiving the message further comprises: receiving downlink control information indicating that the Reed-Solomon code is applied to the one or more scheduled signals.

Aspect 8: The method of any of aspects 1 through 7, wherein receiving the message further comprises: receiving a radio resource control message indicating that the Reed-Solomon code is applied to the one or more scheduled signals.

Aspect 9: The method of any of aspects 1 through 8, wherein receiving the message further comprises: receiving a medium access control (MAC) control element (MAC-CE) message indicating that the Reed-Solomon code is applied to the one or more scheduled signals.

Aspect 10: The method of any of aspects 1 through 9, wherein transmitting the indication further comprises: transmitting a radio resource control message, a medium access control (MAC) control element (MAC-CE) message, or an uplink control information message comprising the indication that the UE is capable of decoding Reed-Solomon codes and that the UE is capable of performing near maximal likelihood demodulation.

Aspect 11: The method of any of aspects 1 through 10, further comprising: receiving a second message indicating that a Low-Density-Parity Check (LDPC) code is applied to one or more other scheduled signals; and applying near the maximal likelihood demodulation and LDPC decoding to the one or more other scheduled signals based at least in part on the second message.

Aspect 12: The method of aspect 11, further comprising: transmitting a request for the Reed-Solomon code to be applied to the one or more other scheduled signals, wherein the UE receives the second message irrespective of the request.

Aspect 13: The method of any of aspects 1 through 12, further comprising: receiving a downlink shared channel, the downlink shared channel comprising the received signal.

Aspect 14: A method for wireless communications at a network entity, comprising: receiving an indication that a UE is capable of decoding Reed-Solomon codes and that the UE is capable of performing near maximal likelihood demodulation; transmitting a message indicating that a Reed-Solomon code is applied to one or more scheduled signals based at least in part on the indication; and applying Reed-Solomon coding to a signal of the one or more scheduled signals based at least in part on the message.

Aspect 15: The method of aspect 14, further comprising: receiving a request for the network entity to apply the Reed-Solomon code to the one or more scheduled signals, wherein transmitting the message and applying the Reed-Solomon coding to the signal is based at least in part on the request.

Aspect 16: The method of aspect 15, wherein the request is included with the indication that the UE is capable of decoding Reed-Solomon codes and that the UE is capable of performing near the maximal likelihood demodulation.

Aspect 17: The method of any of aspects 15 through 16, further comprising: receiving a channel state information report comprising uplink control information, wherein the request is included with the uplink control information.

Aspect 18: The method of any of aspects 14 through 17, further comprising: determining that the UE is operating at high throughput, with high power consumption, or both, wherein transmitting the message and applying the Reed-Solomon coding to the signal is based at least in part on the determination.

Aspect 19: The method of aspect 18, wherein the high throughput is associated with a high SNR, a large constellation, a high code rate, a large number of layers, a rank, or a combination thereof.

Aspect 20: The method of any of aspects 14 through 19, wherein transmitting the message further comprises: transmitting downlink control information indicating that the Reed-Solomon code is applied to the one or more scheduled signals.

Aspect 21: The method of any of aspects 14 through 20, wherein transmitting the message further comprises: transmitting a radio resource control message indicating that the Reed-Solomon code is applied to the one or more scheduled signals.

Aspect 22: The method of any of aspects 14 through 21, wherein transmitting the message further comprises: transmitting a medium access control (MAC) control element (MAC-CE) message indicating that the Reed-Solomon code is applied to the one or more scheduled signals.

Aspect 23: The method of any of aspects 14 through 22, wherein receiving the indication further comprises: receiving a radio resource control message, a medium access control (MAC) control element (MAC-CE) message, or an uplink control information message comprising the indication that the UE is capable of decoding Reed-Solomon codes and that the UE is capable of performing near maximal likelihood demodulation.

Aspect 24: The method of any of aspects 14 through 23, further comprising: transmitting a second message indicating that a Low-Density-Parity Check (LDPC) code is applied to one or more other scheduled signals; and applying LDPC coding to the one or more other scheduled signals in accordance with the second message.

Aspect 25: The method of aspect 24, further comprising: receiving a request for the network entity to apply the Reed-Solomon code to the one or more other scheduled signals; and determining to apply LDPC coding to the one or more other scheduled signals irrespective of the request, wherein transmitting the second message and applying LDPC coding is based at least in part on the determination.

Aspect 26: The method of any of aspects 14 through 25, further comprising: transmitting a downlink shared channel, the downlink shared channel comprising the signal.

Aspect 27: An apparatus for wireless communications at a UE, comprising a processor; memory coupled with the processor; and instructions stored in the memory and executable by the processor to cause the apparatus to perform a method of any of aspects 1 through 13.

Aspect 28: An apparatus for wireless communications at a UE, comprising at least one means for performing a method of any of aspects 1 through 13.

Aspect 29: A non-transitory computer-readable medium storing code for wireless communications at a UE, the code comprising instructions executable by a processor to perform a method of any of aspects 1 through 13.

Aspect 30: An apparatus for wireless communications at a network entity, comprising a processor; memory coupled with the processor; and instructions stored in the memory and executable by the processor to cause the apparatus to perform a method of any of aspects 14 through 26.

Aspect 31: An apparatus for wireless communications at a network entity, comprising at least one means for performing a method of any of aspects 14 through 26.

Aspect 32: A non-transitory computer-readable medium storing code for wireless communications at a network entity, the code comprising instructions executable by a processor to perform a method of any of aspects 14 through 26.

It should be noted that the methods described herein describe possible implementations, and that the operations and the steps may be rearranged or otherwise modified and that other implementations are possible. Further, aspects from two or more of the methods may be combined.

Although aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR networks. For example, the described techniques may be applicable to various other wireless communications systems such as Ultra Mobile Broadband (UMB), Institute of Electrical and Electronics Engineers (IEEE) 802.11 (Wi-Fi), IEEE 802.16 (WiMAX), IEEE 802.20, Flash-OFDM, as well as other systems and radio technologies not explicitly mentioned herein.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative blocks and components described in connection with the disclosure herein may be implemented or performed with a general-purpose processor, a DSP, an ASIC, a CPU, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein may be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that may be accessed by a general-purpose or special-purpose computer. By way of example, and not limitation, non-transitory computer-readable media may include RAM, ROM, electrically erasable programmable ROM (EEPROM), flash memory, compact disk (CD) ROM or other optical disk storage, magnetic disk storage or other magnetic storage devices, or any other non-transitory medium that may be used to carry or store desired program code means in the form of instructions or data structures and that may be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of computer-readable medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an example step that is described as "based on condition A" may be based on both a condition A and a condition B without departing from the scope of the present disclosure. In other words, as used herein, the phrase "based on" shall be construed in the same manner as the phrase "based at least in part on."

The term "determine" or "determining" encompasses a variety of actions and, therefore, "determining" can include calculating, computing, processing, deriving, investigating, looking up (such as via looking up in a table, a database or another data structure), ascertaining and the like. Also, "determining" can include receiving (such as receiving information), accessing (such as accessing data in a memory) and the like. Also, "determining" can include resolving, obtaining, selecting, choosing, establishing and other such similar actions.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "example" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, known structures and devices are shown in block diagram form in order to avoid obscuring the concepts of the described examples.

The description herein is provided to enable a person having ordinary skill in the art to make or use the disclosure. Various modifications to the disclosure will be apparent to a person having ordinary skill in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method for wireless communications at a user equipment (UE), comprising:
    transmitting an indication that the UE is capable of decoding Reed-Solomon codes and that the UE is capable of performing near maximal likelihood demodulation;
    receiving a message indicating that a Reed-Solomon code is applied to one or more scheduled signals based at least in part on the indication;
    receiving a downlink shared channel; and
    applying near maximal likelihood demodulation and Reed-Solomon decoding to a received signal of the one or more scheduled signals based at least in part on the message, the downlink shared channel comprising the received signal.

2. The method of claim 1, further comprising:
    transmitting a request for the Reed-Solomon code to be applied to the one or more scheduled signals, wherein receiving the message is based at least in part on the request.

3. The method of claim 2, wherein the UE transmits the request with the indication that the UE is capable of decoding Reed-Solomon codes and that the UE is capable of performing near maximal likelihood demodulation.

4. The method of claim 2, further comprising:
    transmitting a channel state information report comprising uplink control information, wherein the UE includes the request with the uplink control information.

5. The method of claim 2, further comprising:
    determining that the UE is operating at high throughput, with high power consumption, or both, wherein transmitting the request is based at least in part on the determination.

6. The method of claim 5, wherein the high throughput is associated with a high signal-to-noise ratio (SNR), a large constellation, a high code rate, a large quantity of layers, a rank, or a combination thereof.

7. The method of claim 1, wherein receiving the message further comprises:
    receiving downlink control information indicating that the Reed-Solomon code is applied to the one or more scheduled signals.

8. The method of claim 1, wherein receiving the message further comprises:
    receiving a radio resource control message indicating that the Reed-Solomon code is applied to the one or more scheduled signals.

9. The method of claim 1, wherein receiving the message further comprises:
    receiving a medium access control (MAC) control element (MAC-CE) message indicating that the Reed-Solomon code is applied to the one or more scheduled signals.

10. The method of claim 1, wherein transmitting the indication further comprises:
    transmitting a radio resource control message, a medium access control (MAC) control element (MAC-CE) message, or an uplink control information message comprising the indication that the UE is capable of decoding Reed-Solomon codes and that the UE is capable of performing near maximal likelihood demodulation.

11. The method of claim 1, further comprising:
receiving a second message indicating that a Low-Density-Parity Check (LDPC) code is applied to one or more other scheduled signals; and
applying the near maximal likelihood demodulation and LDPC decoding to the one or more other scheduled signals based at least in part on the second message.

12. The method of claim 11, further comprising:
transmitting a request for the Reed-Solomon code to be applied to the one or more other scheduled signals, wherein the UE receives the second message irrespective of the request.

13. A method for wireless communications at a network entity, comprising:
receiving an indication that a user equipment (UE) is capable of decoding Reed-Solomon codes and that the UE is capable of performing near maximal likelihood demodulation;
transmitting a message indicating that a Reed-Solomon code is applied to one or more scheduled signals based at least in part on the indication;
applying Reed-Solomon coding to a signal of the one or more scheduled signals based at least in part on the message; and
transmitting a downlink shared channel, the downlink shared channel comprising the signal.

14. The method of claim 13, further comprising:
receiving a request for the network entity to apply the Reed-Solomon code to the one or more scheduled signals, wherein transmitting the message and applying Reed-Solomon coding to the signal is based at least in part on the request.

15. The method of claim 14, further comprising:
receiving a channel state information report comprising uplink control information, wherein the request is included with the uplink control information.

16. The method of claim 13, wherein transmitting the message further comprises:
transmitting downlink control information, a radio resource control message, a medium access control (MAC) control element (MAC-CE) message, or a combination thereof indicating that the Reed-Solomon code is applied to the one or more scheduled signals.

17. An apparatus for wireless communications at a user equipment (UE), comprising:
a processor;
memory coupled with the processor; and
instructions stored in the memory and executable by the processor to cause the apparatus to:
transmit an indication that the UE is capable of decoding Reed-Solomon codes and that the UE is capable of performing near maximal likelihood demodulation;
receive a message indicating that a Reed-Solomon code is applied to one or more scheduled signals based at least in part on the indication;
receive a downlink shared channel; and
apply near maximal likelihood demodulation and Reed-Solomon decoding to a received signal of the one or more scheduled signals based at least in part on the message, the downlink shared channel comprising the received signal.

18. The apparatus of claim 17, wherein the instructions are further executable by the processor to cause the apparatus to:
transmit a request for the Reed-Solomon code to be applied to the one or more scheduled signals, wherein receiving the message is based at least in part on the request.

19. The apparatus of claim 18, wherein the UE transmits the request with the indication that the UE is capable of decoding Reed-Solomon codes and that the UE is capable of performing near maximal likelihood demodulation.

20. The apparatus of claim 18, wherein the instructions are further executable by the processor to cause the apparatus to:
transmit a channel state information report comprising uplink control information, wherein the UE includes the request with the uplink control information.

21. The apparatus of claim 18, wherein the instructions are further executable by the processor to cause the apparatus to:
determine that the UE is operating at high throughput, with high power consumption, or both, wherein transmitting the request is based at least in part on the determination.

22. The apparatus of claim 21, wherein the high throughput is associated with a high signal-to-noise ratio (SNR), a large constellation, a high code rate, a large quantity of layers, a rank, or a combination thereof.

23. The apparatus of claim 17, wherein the instructions to receive the message are further executable by the processor to cause the apparatus to:
receive downlink control information indicating that the Reed-Solomon code is applied to the one or more scheduled signals.

24. The apparatus of claim 17, wherein the instructions to receive the message are further executable by the processor to cause the apparatus to:
receive a radio resource control message indicating that the Reed-Solomon code is applied to the one or more scheduled signals.

25. The apparatus of claim 17, wherein the instructions to receive the message are further executable by the processor to cause the apparatus to:
receive a medium access control (MAC) control element (MAC-CE) message indicating that the Reed-Solomon code is applied to the one or more scheduled signals.

26. The apparatus of claim 17, wherein the instructions to transmit the indication are further executable by the processor to cause the apparatus to:
transmit a radio resource control message, a medium access control (MAC) control element (MAC-CE) message, or an uplink control information message comprising the indication that the UE is capable of decoding Reed-Solomon codes and that the UE is capable of performing near maximal likelihood demodulation.

27. The apparatus of claim 17, wherein the instructions are further executable by the processor to cause the apparatus to:
receive a second message indicating that a Low-Density-Parity Check (LDPC) code is applied to one or more other scheduled signals; and
apply the near maximal likelihood demodulation and LDPC decoding to the one or more other scheduled signals based at least in part on the second message.

28. The apparatus of claim 27, wherein the instructions are further executable by the processor to cause the apparatus to:
- transmit a request for the Reed-Solomon code to be applied to the one or more other scheduled signals, wherein the UE receives the second message irrespective of the request.

29. An apparatus for wireless communications at a network entity, comprising:
- a processor;
- memory coupled with the processor; and
- instructions stored in the memory and executable by the processor to cause the apparatus to:
  - receive an indication that a user equipment (UE) is capable of decoding Reed-Solomon codes and that the UE is capable of performing near maximal likelihood demodulation;
  - transmit a message indicating that a Reed-Solomon code is applied to one or more scheduled signals based at least in part on the indication;
  - apply Reed-Solomon coding to a signal of the one or more scheduled signals based at least in part on the message; and
  - transmit a downlink shared channel, the downlink shared channel comprising the signal.

30. The apparatus of claim 29, wherein the instructions are further executable by the processor to cause the apparatus to:
- receive a request for the network entity to apply the Reed-Solomon code to the one or more scheduled signals, wherein transmitting the message and applying Reed-Solomon coding to the signal is based at least in part on the request.

* * * * *